US012588310B2

(12) United States Patent
Shirahige

(10) Patent No.: US 12,588,310 B2
(45) Date of Patent: Mar. 24, 2026

(54) PHOTOELECTRIC CONVERSION APPARATUS, PHOTOELECTRIC CONVERSION SYSTEM, AND MOVING BODY

(71) Applicant: CANON KABUSHIKI KAISHA, Tokyo (JP)

(72) Inventor: Daiki Shirahige, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 400 days.

(21) Appl. No.: 18/321,356

(22) Filed: May 22, 2023

(65) Prior Publication Data

US 2023/0387167 A1      Nov. 30, 2023

(30) Foreign Application Priority Data

May 27, 2022      (JP) ................................. 2022-086972

(51) Int. Cl.
  *H10F 39/12*        (2025.01)
  *H10F 39/00*        (2025.01)
  *H10F 39/18*        (2025.01)
(52) U.S. Cl.
  CPC ....... *H10F 39/8063* (2025.01); *H10F 39/182* (2025.01); *H10F 39/807* (2025.01); *H10F 39/12* (2025.01)
(58) Field of Classification Search
  CPC .... H10F 39/12; H10F 39/182; H10F 39/8063; H05N 23/10–959; H05N 25/10–79
  See application file for complete search history.

(56) References Cited

U.S. PATENT DOCUMENTS

| | | | | |
|---|---|---|---|---|
| 2018/0374886 A1* | 12/2018 | Iwata | ...................... | H10F 30/28 |
| 2019/0035827 A1* | 1/2019 | Kawabata | ............. | H10F 39/182 |
| 2020/0235148 A1* | 7/2020 | Shim | ................... | H10F 39/8027 |
| 2020/0273894 A1* | 8/2020 | Inui | ........................... | G06T 7/55 |

FOREIGN PATENT DOCUMENTS

JP          2020141122 A          9/2020

* cited by examiner

*Primary Examiner* — Christine S. Kim
*Assistant Examiner* — Tien Tran
(74) *Attorney, Agent, or Firm* — Canon U.S.A., Inc. IP Division

(57) ABSTRACT

An apparatus includes pixels each including regions provided in a layer and a microlens. The layer has a first depth, a second depth, and a third depth between the first and second depths in order from a side of a surface facing a surface where the microlens is formed. The layer includes a first portion that separates the regions at the first depth and extends in a first direction, a second portion that separates the regions at the second depth and extends in a second direction, and a third portion that separates the regions at the third depth and extends in a third direction. An angle formed by the first and third portions and less than or equal to 90 degrees is smaller than an angle formed by the first and second portions and less than or equal to 90 degrees.

20 Claims, 20 Drawing Sheets

FIG.16

LIGHT SOURCE
APPARATUS
*411*

*401*

MEMORY
*406*

*407*

*408*
PHOTOELECTRIC
CONVERSION
APPARATUS

*404*
IMAGE
PROCESSING
CIRCUIT

*405*
MONITOR

PHOTOELECTRIC CONVERSION APPARATUS, PHOTOELECTRIC CONVERSION SYSTEM, AND MOVING BODY

BACKGROUND

Technical Field

The aspect of the embodiments relates to a photoelectric conversion apparatus, a photoelectric conversion system, and a moving body.

Description of the Related Art

In a case where a plurality of photoelectric conversion elements is arranged under a pixel microlens in a photoelectric conversion apparatus, and imaging and phase difference detection are performed by the same sensor, the accuracy of autofocus (AF) can decrease depending on the direction of contrast of a subject. This issue can be addressed by making a separation direction different between a first layer and a second layer of the photoelectric conversion elements laminated in a light incident direction as illustrated in FIGS. 20A and 20B of Japanese Patent Application Laid-Open No. 2020-141122.

However, in a pixel structure discussed in Japanese Patent Application Laid-Open No. 2020-141122, the accuracy of phase difference detection can be decreased by crosstalk between the laminated photoelectric conversion elements.

SUMMARY

According to an aspect of the embodiments, an apparatus includes a plurality of pixels each including a plurality of regions provided in a layer and a microlens. The layer has a first depth, a second depth, and a third depth between the first depth and the second depth in order from a side of a surface of the layer that faces a surface of the layer on which the microlens is formed. The layer includes a first portion that separates the plurality of regions at the first depth and extends in a first direction, a second portion that separates the plurality of regions at the second depth and extends in a second direction, and a third portion that separates the plurality of regions at the third depth and extends in a third direction. An angle that is formed by the first portion and the third portion and is less than or equal to 90 degrees is smaller than an angle that is formed by the first portion and the second portion and is less than or equal to 90 degrees.

Further features of the disclosure will become apparent from the following description of exemplary embodiments with reference to the attached drawings.

BRIEF DESCRIPTION OF THE DRAWINGS

FIG. 16 is a functional block diagram illustrating a photoelectric conversion system according to a fifth exemplary embodiment.

DESCRIPTION OF THE EMBODIMENTS

Figure 1:
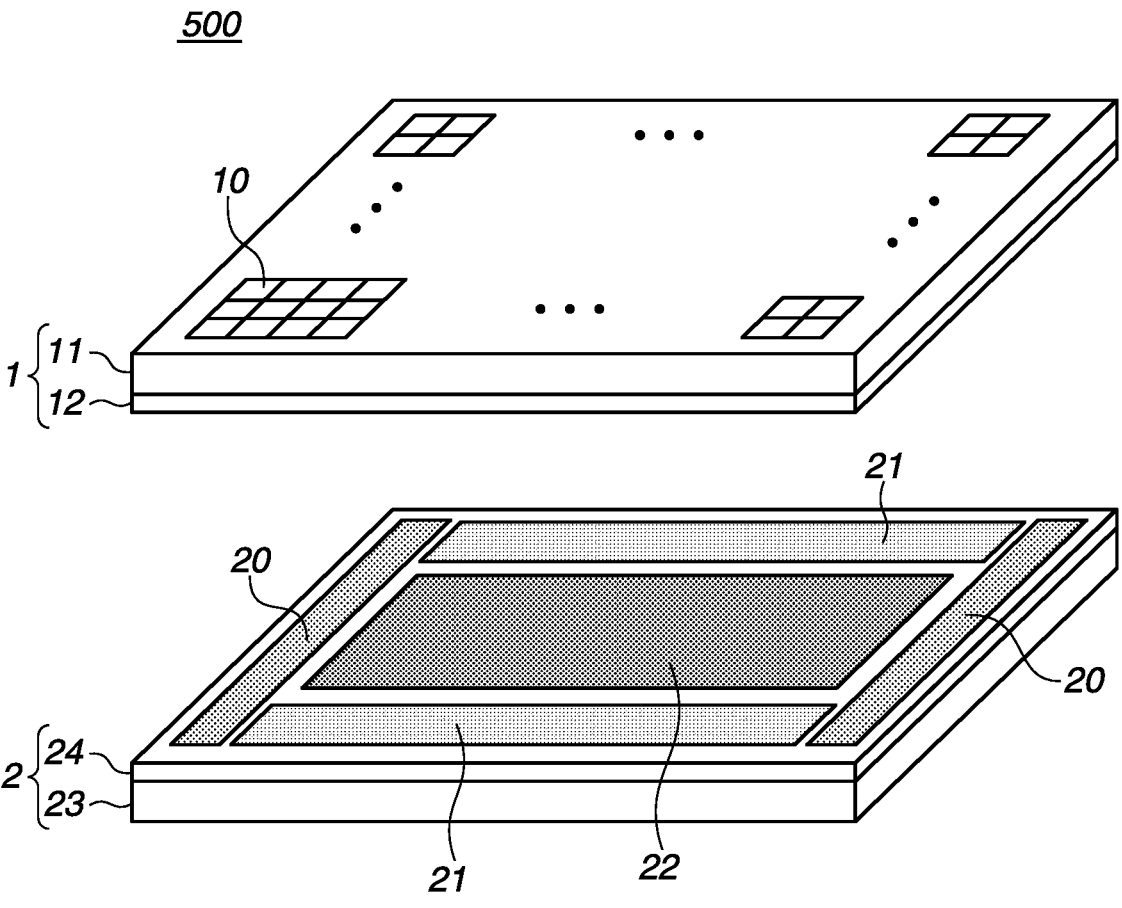
FIG. 1 is a schematic view illustrating each semiconductor substrate of a photoelectric conversion apparatus according to a first exemplary embodiment.

The following exemplary embodiments are specific examples of the technical idea of the disclosure and are not intended to limit the disclosure. Sizes and positional relationships of members illustrated in the drawings may be exaggerated for clarity of description. In the following description, the same components are denoted by the same reference numerals, and the descriptions thereof may be omitted.

In the following description, a case where a signal charge is an electron will be described as an example. Thus, a first conductivity type semiconductor region in which a majority of carriers has the same conductivity type as the signal charge is an N-type semiconductor region, and a second conductivity type semiconductor region is a P-type semiconductor region. Even in a case where the signal charge is a hole, the exemplary embodiments of the disclosure can be implemented. In this case, the first conductivity type semiconductor region in which the majority of carriers has the same conductivity type as the signal charge is the P-type semiconductor region, and the second conductivity type semiconductor region is the N-type semiconductor region.

In a case where a term "impurity concentration" is simply used in the present specification and claims, it means a net impurity concentration compensated for by an opposite conductivity type impurity. In other words, the "impurity concentration" refers to a net doping concentration. A region where a P-type additive impurity concentration is higher than an N-type additive impurity concentration is the P-type semiconductor region. On the contrary, a region where the N-type additive impurity concentration is higher than the P-type additive impurity concentration is the N-type semiconductor region. A semiconductor region, a conductivity type of a well, and a dopant to be implanted, which will be described in the following exemplary embodiments, are merely examples and the exemplary embodiments are not limited to those described in the exemplary embodiments. The conductivity type and the dopant described in the exemplary embodiments can be appropriately changed. Further, with this change, the semiconductor region and potential of the well are changed accordingly.

In the present specification, a "plan view" refers to viewing from a direction perpendicular to a light incident surface of a semiconductor substrate (described below) or a surface facing the light incident surface. A cross section refers to a surface of the semiconductor substrate perpendicular to the light incident surface. If the light incident surface of the semiconductor substrate is a rough surface from a microscopic point of view, the plan view is defined with reference to the light incident surface of the semiconductor substrate from a macroscopic point of view.

In the present specification, a depth direction is a direction from the light incident surface (a first surface) of the semiconductor substrate to a surface (a second surface) of the semiconductor substrate where a transistor is arranged.

In each of the following exemplary embodiments, an image capturing apparatus will be mainly described as an example of a photoelectric conversion apparatus, but each of the exemplary embodiments is not limited to the image capturing apparatus and is applicable to other examples of photoelectric conversion apparatuses. The other examples include a ranging apparatus (an apparatus for measuring a distance using focus detection or time of flight (TOF)) and a photometric apparatus (an apparatus for measuring an incident light amount).

A first exemplary embodiment of the disclosure will be described with reference to FIGS. 1 to 9.

FIG. 1 illustrates a photoelectric conversion apparatus 500 according to the present exemplary embodiment.

The photoelectric conversion apparatus 500 is a semiconductor device integrated circuit (IC). The photoelectric conversion apparatus 500 according to the present exemplary embodiment can be used as, for example, an image sensor, a photometric sensor, or a ranging sensor. A complementary metal oxide semiconductor (CMOS) image sensor will be described below as an example of the photoelectric conversion apparatus 500.

The photoelectric conversion apparatus 500 is a lamination type photoelectric conversion apparatus in which all or a part of a substrate 1 and a substrate 2 are laminated and bonded. The substrates 1 and 2 can be in a chip state where a wafer is diced into chips after lamination, or can be in a wafer state. The photoelectric conversion apparatus 500 is a lamination type back-illuminated photoelectric conversion apparatus.

The substrate 1 includes a semiconductor element layer 11 including pixel circuits of a plurality of pixels 10, and a wiring structure 12. The substrate 2 includes a wiring structure 24 and a semiconductor element layer 23 including an electrical circuit.

The wiring structure 12 of the substrate 1 and the wiring structure 24 of the substrate 2 are bonded by a metal bonding portion formed by bonding wiring layers included in the wiring structures 12 and 24. The metal bonding portion has a structure in which a metal forming a wiring layer and a metal forming a wiring layer are directly bonded together.

Elements of each pixel 10 are arranged in the semiconductor element layer 11. A part of the elements of each pixel 10 can be arranged in the semiconductor element layer 11 and the other part can be arranged in the semiconductor element layer 23. In this case, the pixel circuits included in the pixels 10 and arranged in the semiconductor element layer 11 include photoelectric conversion regions of photodiodes. The pixel circuits including the photoelectric conversion regions are arranged in a two-dimensional array in the semiconductor element layer 11 in plan view. The semiconductor element layer 11 includes a pixel region in which the plurality of pixel circuits is arranged in the two-dimensional array. In FIG. 1, a plurality of photoelectric conversion units included in the plurality of pixel circuits is arranged in a two-dimensional array in a row direction and a column direction in the semiconductor element layer 11.

The wiring structure 12 includes the wiring layer having M (M is an integer greater than or equal to one) layers, and an interlayer insulating material. The wiring structure 24 includes the wiring layer having N (N is an integer greater than or equal to one) layers, and an interlayer insulating material.

The semiconductor element layer 23 includes the electrical circuit that processes signals acquired by the photoelectric conversion units arranged in the semiconductor element layer 11. For the convenience of description, the configuration illustrated on a top surface of the substrate 2 in FIG. 1 is the configuration arranged in the semiconductor element layer 23. The electrical circuit is, for example, any one of transistors that form a vertical scanning circuit 20, a horizontal scanning circuit 21, a signal processing circuit 22, and the like illustrated in FIG. 1. The signal processing circuit 22 is, for example, at least one of a part of the configuration of each pixel 10, such as an amplification transistor, a selection transistor, and a reset transistor, an amplification circuit, a selection circuit, a logical operation circuit, an analog-to-digital (AD) conversion circuit, a memory, or a circuit performing compression processing or composition processing.

Each pixel 10 can be referred to as a minimum unit of a circuit to be repeatedly arranged to form an image.

The pixel circuits included in the plurality of pixels 10 and arranged in the semiconductor element layer 11 include at least the photoelectric conversion units. The pixel circuits can include components other than the photoelectric conversion units.

For example, the pixel circuits can each further include at least one of a transfer transistor, a floating diffusion (FD), a reset transistor, an amplification transistor, a capacity connection transistor, or a selection transistor. Typically, a selection transistor and a group of elements connected to a signal line 28 (see FIG. 2) via the selection transistor are included in each pixel 10. In other words, the selection transistor can be an outer edge of each pixel circuit. Alternatively, a set of a photoelectric conversion unit and a transfer transistor can be included in each pixel 10. Further alternatively, a set of one or more photoelectric conversion units and one amplification circuit or one AD conversion circuit can be included in each pixel 10.

Figure 2:
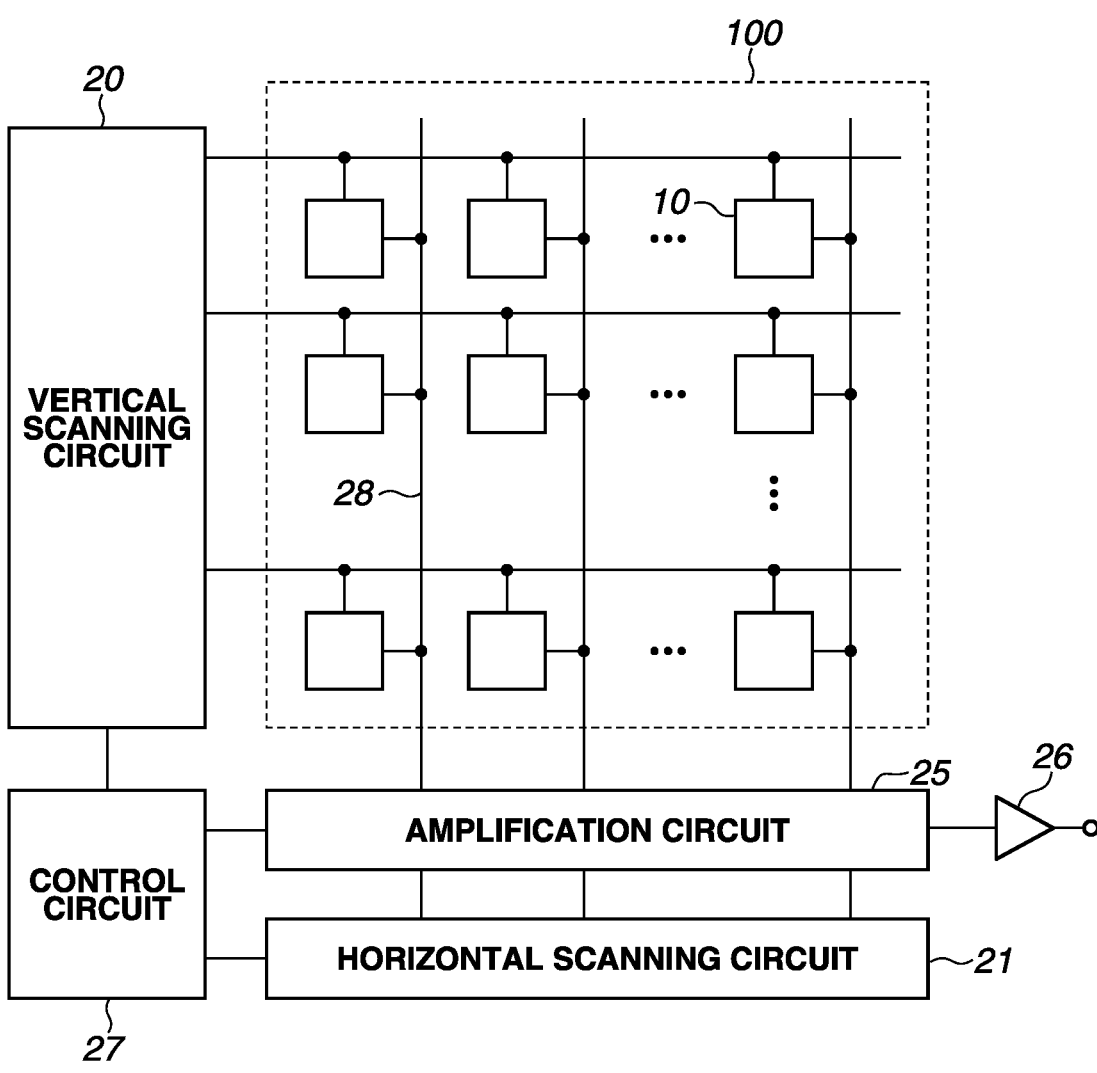
FIG. 2 is a block diagram illustrating the photoelectric conversion apparatus according to the first exemplary embodiment.

FIG. 2 is a block diagram illustrating a schematic configuration of the photoelectric conversion apparatus 500 according to the present exemplary embodiment.

The photoelectric conversion apparatus 500 includes a pixel array 100, the vertical scanning circuit 20, an amplification circuit 25, the horizontal scanning circuit 21, an output circuit 26, and a control circuit 27. The pixel array 100 includes the plurality of pixels 10 two-dimensionally arranged in a plurality of rows and a plurality of columns, in plan view. The vertical scanning circuit 20 supplies a plurality of control signals for controlling the plurality of transistors included in the pixels 10 to be turned on (put into a conductive state) or turned off (put into a non-conductive state). The signal line 28 is provided for each column of the pixels 10, and signals from the pixels 10 in each column are read out to the corresponding signal line 28. The amplification circuit 25 amplifies the pixel signals output to the signal line 28 and performs processing such as correlated double sampling processing based on signals at the time of resetting the pixels 10 and at the time of photoelectric conversion. The horizontal scanning circuit 21 supplies a control signal for controlling a switch connected to an amplifier of the amplification circuit 25 to be turned on or off. The control circuit 27 controls the vertical scanning circuit 20, the amplification circuit 25, and the horizontal scanning circuit 21. The output circuit 26 includes a buffer amplifier and a differential amplifier and outputs the pixel signals from the amplification circuit 25 to a signal processing unit outside the photoelectric conversion apparatus 500. Alternatively, the photoelectric conversion apparatus 500 can output digital pixel signals using an AD conversion unit additionally provided therein. The control circuit 27, the amplification circuit 25, and the output circuit 26 are included in the signal processing circuit 22 in FIG. 1.

Figure 3:
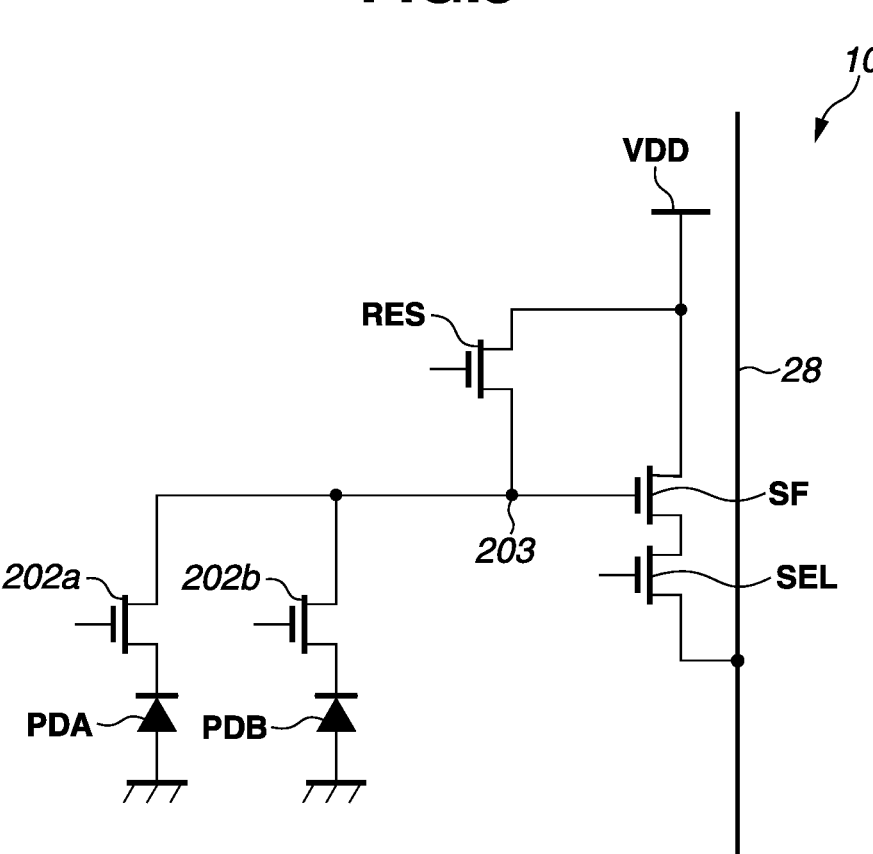
FIG. 3 is an equivalent circuit diagram of a pixel of the photoelectric conversion apparatus according to the first exemplary embodiment.

FIG. 3 illustrates an example of an equivalent circuit of each pixel 10 of the photoelectric conversion apparatus 500 according to the present exemplary embodiment.

A configuration will be described in which two photoelectric conversion units PDA and PDB share one floating diffusion (FD) 203, but the number of photoelectric conversion units sharing the FD 203 is not limited thereto. Each of the two photoelectric conversion units PDA and PDB can be provided with a different FD. Each pixel 10 includes the photoelectric conversion units PDA and PDB, transfer transistors 202 (202a and 202b), the FD 203, a reset transistor RES, a source follower transistor SF, and a selection transistor SEL. Control signals for controlling these transistors are input from the vertical scanning circuit 20 illustrated in FIG. 1 to respective gates of the transistors via control lines.

Figure 4A:
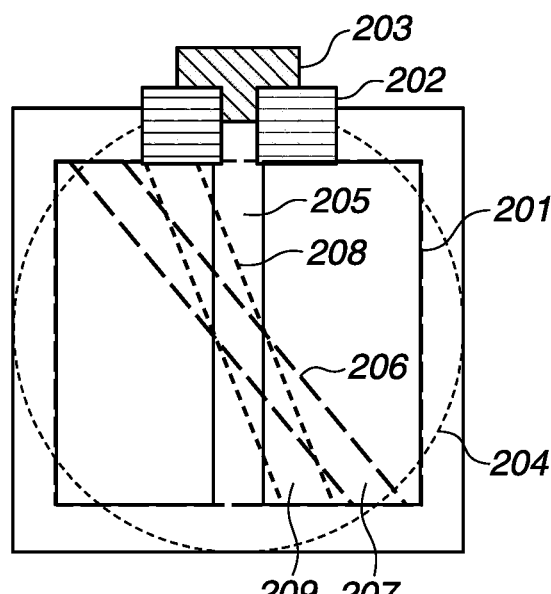
FIGS. 4A to 4F are plan views of the pixel of the photoelectric conversion apparatus according to the first exemplary embodiment.
Figure 4D:
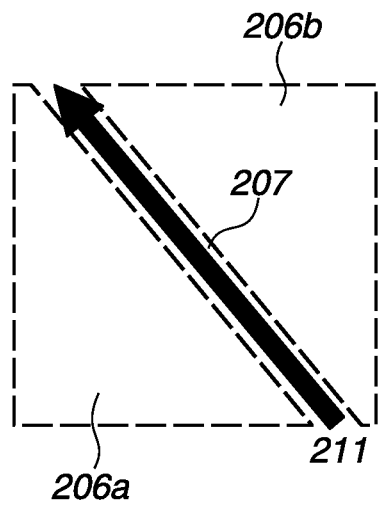
Figure 4B:
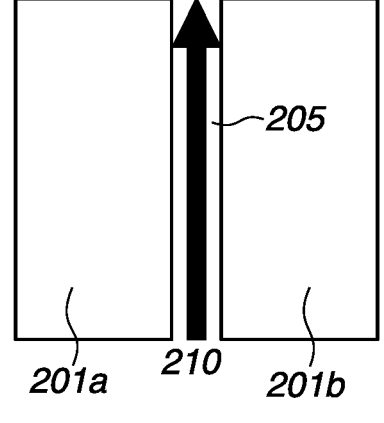
Figure 4E:
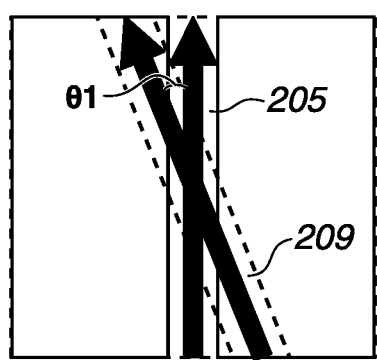
Figure 4C:
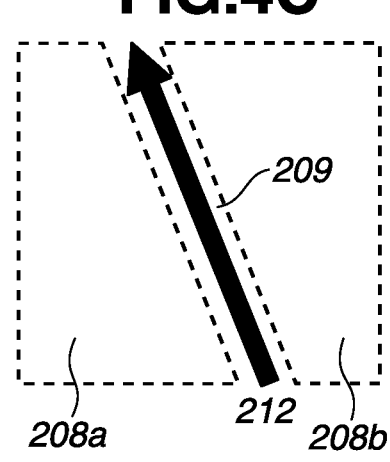
Figure 4F:
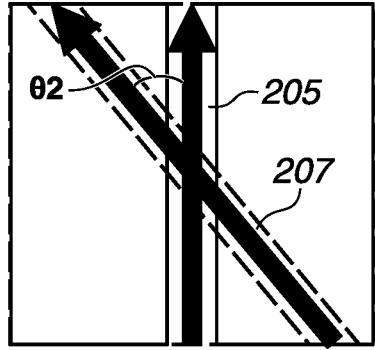

FIGS. 4A to 4F are plan views of each pixel 10 of the photoelectric conversion apparatus 500 according to the present exemplary embodiment. FIG. 4A is a top schematic view of each pixel 10. Each of FIGS. 4B, 4C, and 4D illustrates a planer structure in a cross section at a different depth from a front surface (a surface facing the light incident surface) side to a back surface (the light incident surface) side of a semiconductor layer (the semiconductor element layer 11) in which the plurality of pixels 10 is formed.

Each pixel 10 includes photoelectric conversion regions 201, 206, and 208, gates of the transfer transistors 202, the FD 203, a microlens 204, and first to third separation portion 205, 207, and 209. The photoelectric conversion regions 201, 206, and 208 are provided at different depths in the semiconductor layer. A planar layout of each of the photoelectric conversion regions 201, 206, and 208 at different depths will be described next.

The photoelectric conversion region 201 is separated into a first photoelectric conversion region 201a and a second photoelectric conversion region 201b. The first photoelectric conversion region 201a and the second photoelectric conversion region 201b are of N-type and are provided on the front surface side (at a first depth) of the semiconductor layer, and the microlens 204 is arranged to cover both of the two photoelectric conversion regions 201. The first photoelectric conversion region 201a and the second photoelectric conversion region 201b are connected to the gates of the transfer transistors 202 and are separated by the first separation portion 205. The first separation portion 205 is provided along a first direction 210. The first photoelectric conversion region 201a and the second photoelectric conversion region 201b, which are separated by the first separation portion 205, are rectangular regions in which the first separation portion 205 is arranged along a longitudinal direction thereof. A shape of each of the two photoelectric conversion regions 201 is not limited to the one having right-angled corners and can be, for example, a rectangular shape with rounded corners.

FIG. 4D illustrates the planer structure on the back surface side of each pixel 10. The back surface side of the each pixel 10 refers to the light incident surface side of the semiconductor layer in which the photoelectric conversion regions 201, 206, and 208 are provided. The photoelectric conversion region 206 is separated into a third photoelectric conversion region 206a and a fourth photoelectric conversion region 206b. The third photoelectric conversion region 206a and the fourth photoelectric conversion region 206b, which are of N-type, are located on the back surface side (at a second depth) of the semiconductor layer and are separated by the second separation portion 207 provided along a second direction 211. The second direction 211 and the first direction 210 are different from each other.

FIG. 4C illustrates the planar structure of an intermediate layer of each pixel 10. The photoelectric conversion region 208 is at a third depth between the photoelectric conversion region 201 at the first depth and the photoelectric conversion region 206 at the second depth in the semiconductor layer. The photoelectric conversion region 208 is separated into a fifth photoelectric conversion region 208a and a sixth photoelectric conversion region 208b by the third separation portion 209 provided along a third direction 212 in plan view. Each of the two photoelectric conversion regions 208 is a trapezoidal region, and the third direction 212 is an intermediate angular direction between the first direction 210 and the second direction 211. In other words, an angle θ1 in FIG. 4E, which is formed by the first separation portion 205 and the third separation portion 209 and is less than or equal to 90 degrees, is smaller than an angle θ2 in FIG. 4F, which is formed by the first separation portion 205 and the second separation portion 207 and is less than or equal to 90 degrees.

Each of the first separation portion 205, the second separation portion 207, and the third separation portion 209 can be, for example, an insulating member such as a trench structure or can be a P-type semiconductor region. Alternatively, a low concentration N-type region can be formed with respect to an N-type impurity concentration in the two photoelectric conversion regions separated by each of the first to third separation portions 205, 207, and 209. In other words, a structure serving as a potential barrier against a signal charge is formed between the two photoelectric conversion regions separated by each of the first to third separation portions 205, 207, and 209.

Figure 5A:
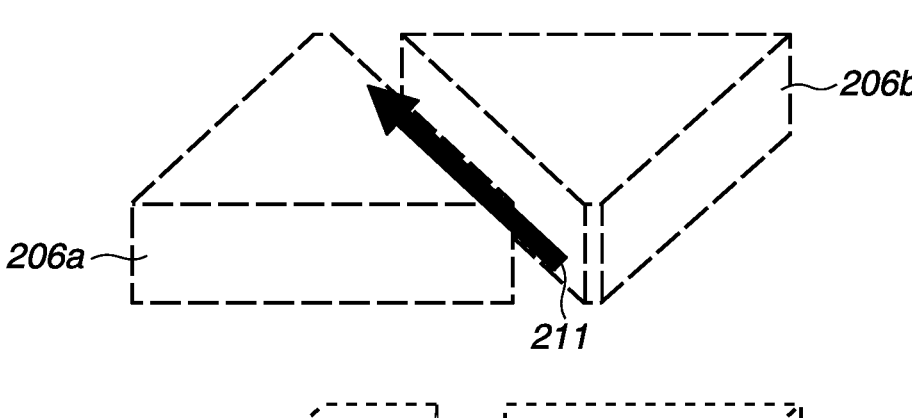
FIGS. 5A and 5B are schematic views illustrating each photoelectric conversion region of the pixel of the photoelectric conversion apparatus according to the first exemplary embodiment.
Figure 5A:
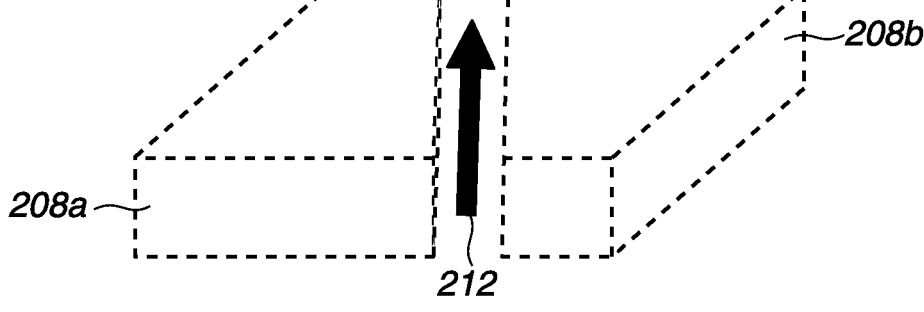
Figure 5A:
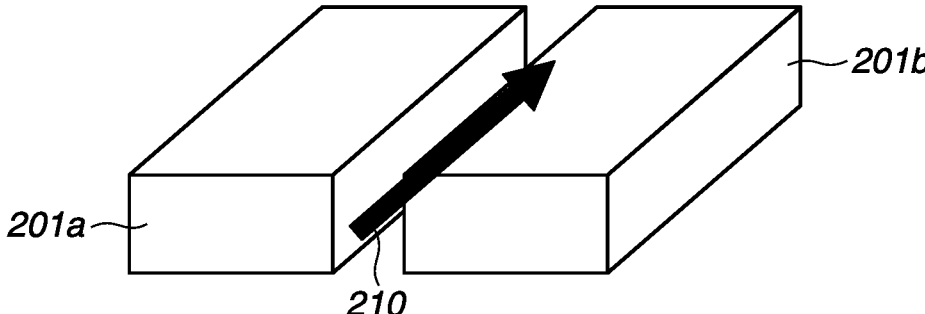
Figure 5B:
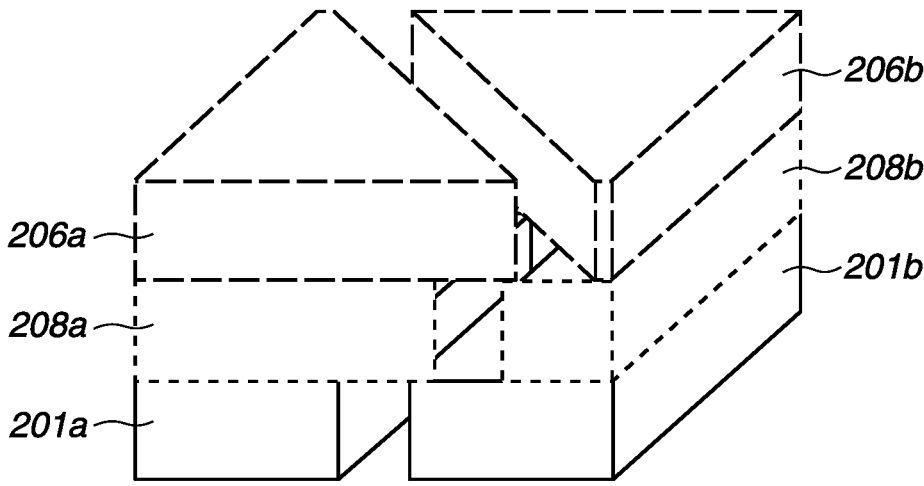

FIGS. 5A and 5B are schematic views of the photoelectric conversion regions 201, 208, and 206 of each pixel 10 with the light incident surface side facing up.

In each pixel 10, the photoelectric conversion regions 201, 208, and 206 are formed at different depths from a side of a substrate front surface, which is the surface facing the light incident surface, to a side of a substrate back surface, which is the light incident surface. As described above, the first separation portion 205 is formed between the two photoelectric conversion regions 201, and the third separation portion 209 is formed between the two photoelectric conversion regions 208. The second separation portion 207 is formed between the two photoelectric conversion regions 206. The first direction 210, the third direction 212, and the second direction 211 are directions in which the photoelectric conversion regions 201, 208, and 206 are separated by the separation portions 205, 209, and 207, respectively, which are all different, and the third direction 212 is the intermediate angular direction between the first direction 210 and the second direction 211 in plan view.

Figure 6A:
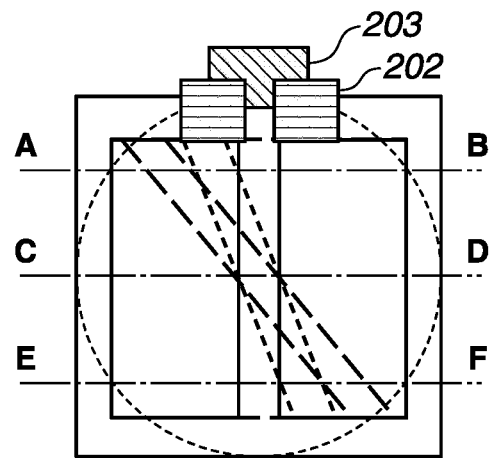
FIG. 6A is a plan view of the pixel of the photoelectric conversion apparatus according to the first exemplary embodiment.
Figure 6C:
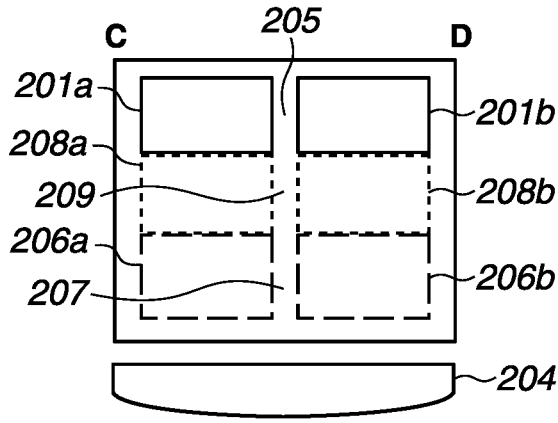
FIGS. 6B to 6D are cross-sectional views of the pixel of the photoelectric conversion apparatus according to the first exemplary embodiment.
Figure 6B:
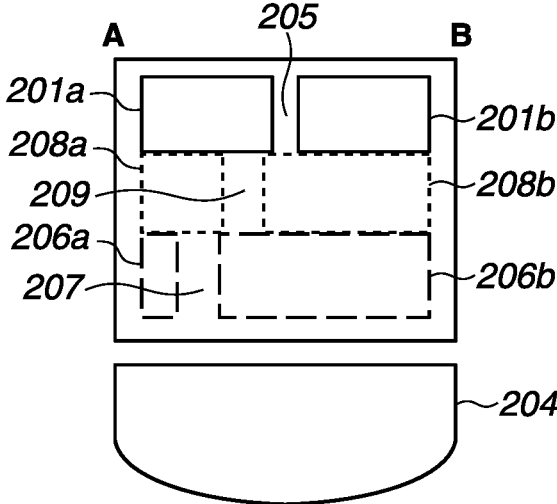
Figure 6D:
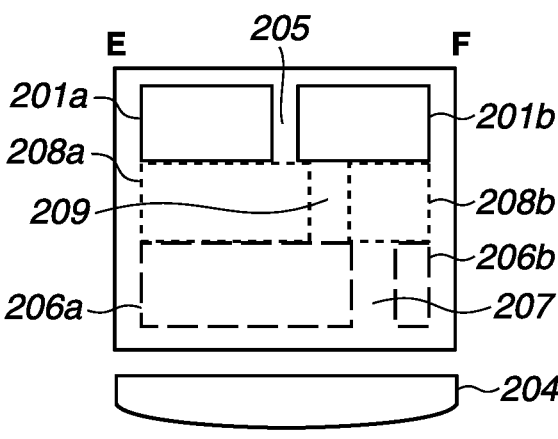

FIG. 6A is a plan view of each pixel 10, and FIGS. 6B to 6D are cross-sectional views of each pixel 10. An A-B cross section, a C-D cross section, and an E-F cross section in FIG. 6A respectively correspond to FIGS. 6B, 6C, and 6D.

The photoelectric conversion regions 201, 208, and 206 are formed from the substrate front surface side on which the gates of the transfer transistors 202 are provided to the substrate back surface side on which the microlens 204 is provided. Each of the photoelectric conversion regions 201, 208, and 206 is separated so that a sum of cross-section areas of the two photoelectric conversion regions is constant. In addition, in the C-D cross section passing through the center of each pixel 10, the cross-section areas of the photoelectric conversion regions 201, 208, and 206 are constant regardless of the depth in the semiconductor layer.

The photoelectric conversion regions 201, 208, and 206 have the same thickness in the cross section in each of FIGS. 6B to 6D. Alternatively, for example, the photoelectric conversion region 208 can be formed thicker than each of the photoelectric conversion regions 201 and 206. Further alternatively, the photoelectric conversion regions 206, 208, and 201 can be formed to be gradually thicker from the photoelectric conversion region 206 on the substrate back surface side to the photoelectric conversion region 201 on the substrate front surface side.

FIGS. 7A to 7D illustrate a comparative example of each pixel 10 of the photoelectric conversion apparatus 500 according to the present exemplary embodiment, where a pixel has a structure without an intermediate layer. The pixel illustrated in FIGS. 7A to 7D has the structure in which the two photoelectric conversion regions 201 and 206 on the substrate front surface side and the substrate back surface side, which have different separation directions, are adjacent to each other.

Figure 7A:
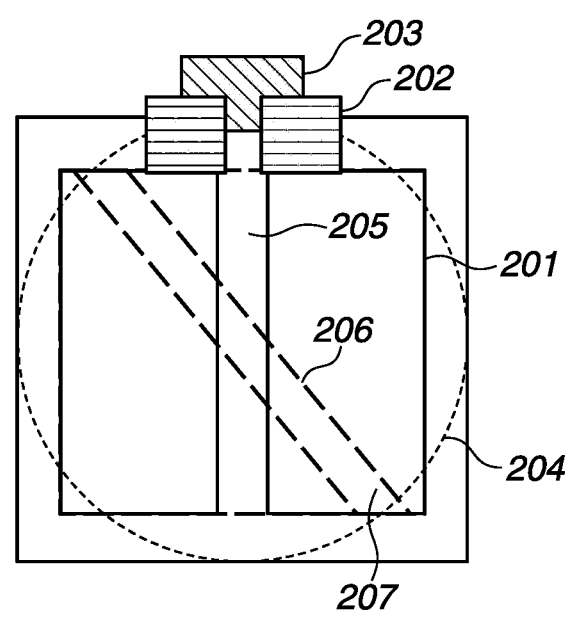
FIGS. 7A to 7D are plan views of a pixel of a photoelectric conversion apparatus according to a comparative example.
Figure 7C:
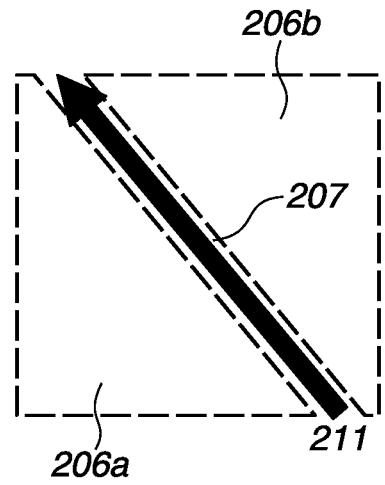
Figure 7B:
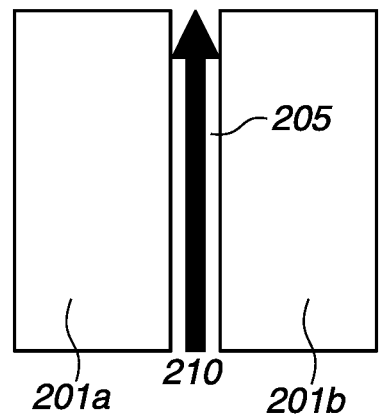

The pixel illustrated in FIGS. 7A to 7D has the photoelectric conversion region 201 on the substrate front surface side in FIG. 7B, and the photoelectric conversion region 206 on the substrate back surface side in FIG. 7C. The photoelectric conversion region 201 is separated into the first photoelectric conversion region 201a and the second photoelectric conversion region 201b by the first separation portion 205 extending along the first direction 210. The photoelectric conversion region 206 is separated into the third photoelectric conversion region 206a and the fourth photoelectric conversion region 206b by the second separation portion 207 extending along the second direction 211.

Figure 7D:
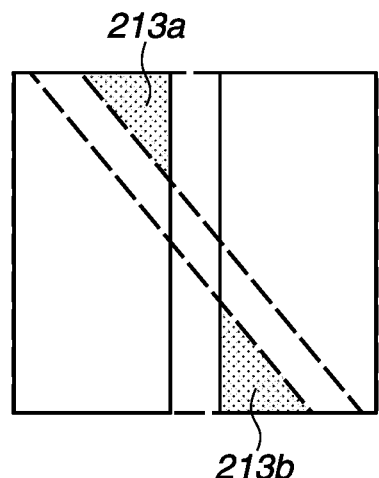

As indicated by hatched areas 213a and 213b in FIG. 7D, in the pixel having such a structure, the first photoelectric conversion region 201a and the fourth photoelectric conversion region 206b are partially in contact with each other (in the hatched area 213a), and the second photoelectric conversion region 201b and the third photoelectric conversion region 206a are partially in contact with each other (in the hatched area 213b). Thus, a part of charges to be transferred from the third photoelectric conversion region 206a to the first photoelectric conversion region 201a can be transferred from the third photoelectric conversion region 206a to the second photoelectric conversion region 201b. Alternatively, a part of charges to be transferred from the fourth photoelectric conversion region 206b to the second photoelectric conversion region 201b can be transferred from the fourth photoelectric conversion region 206b to the first photoelectric conversion region 201a. In other words, there is a possibility that the charges can move along a wrong transfer path. Consequently, there is a possibility that a signal used for phase difference detection cannot be acquired correctly, and the accuracy of phase difference detection can decrease.

In the present exemplary embodiment, the photoelectric conversion region 208 is provided as an intermediate pixel layer between the photoelectric conversion regions 201 and 206, and the third direction 212, which is a separation angle of the photoelectric conversion region 208, is set to an angle between the first direction 210 and the second direction 211. Accordingly, an angle change in the photoelectric conversion region separation direction is gradual from the substrate back surface to the substrate front surface, and the interlayer overlap between the photoelectric conversion regions "a" (206a, 208a, and 201a) and the photoelectric conversion regions "b" (206b, 208b, and 201b) is reduced. For example, the overlap between the third photoelectric conversion region 206a and the sixth photoelectric conversion region 208b in FIGS. 4C and 4D is small compared with the overlap (the hatched area 213b) between the third photoelectric conversion region 206a and the second photoelectric conversion region 201b in FIG. 7D. The overlap between the fifth photoelectric conversion region 208a and the second photoelectric conversion region 201b in FIGS. 4B and 4C is small compared with the overlap (the hatched area 213b) between the third photoelectric conversion region 206a and the second photoelectric conversion region 201b in FIG. 7D. In other words, a possibility that a signal to be transferred between the photoelectric conversion regions "a" can be transferred from the photoelectric conversion regions "a" to the photoelectric conversion regions "b" is reduced. As a result, the signal used for phase difference detection is acquired correctly, and the accuracy of phase difference detection is improved compared with a case where the photoelectric conversion region 208 is not present.

Figure 8A:
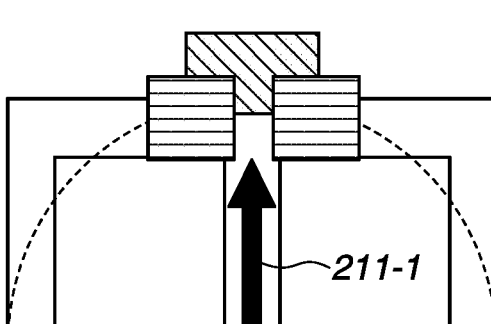
FIGS. 8A to 8D are views illustrating examples of a separation direction of a photoelectric conversion region of the pixel of the photoelectric conversion apparatus according to the first exemplary embodiment.
Figure 8C:
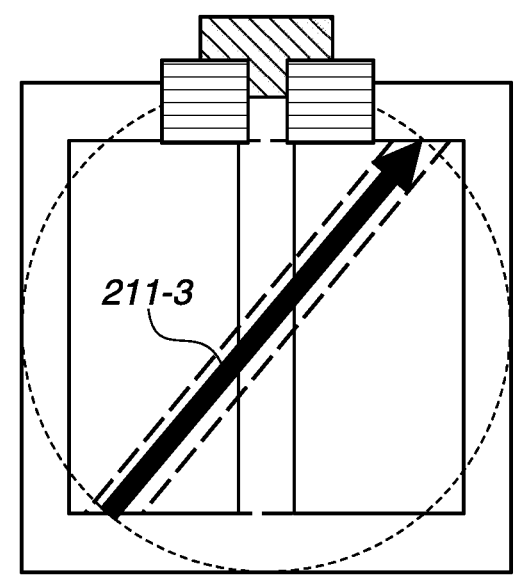
Figure 8B:
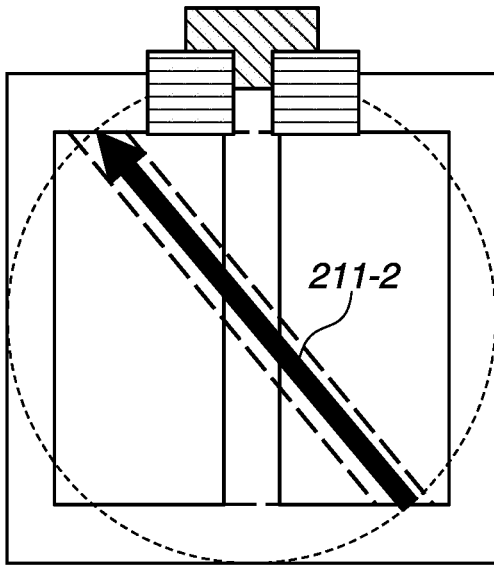
Figure 8D:
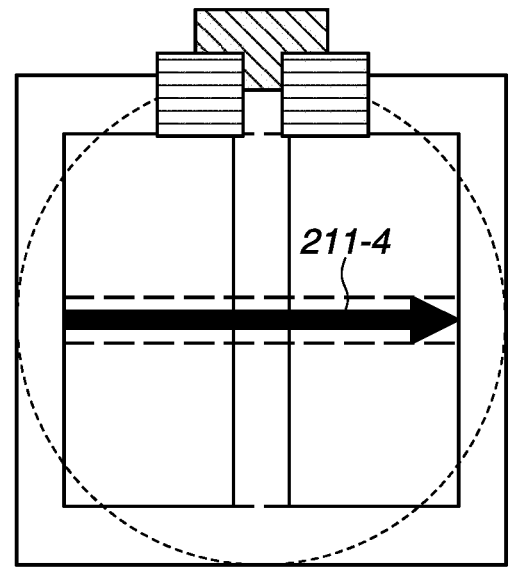

FIGS. 8A to 8D illustrate examples of the angle formed by the second direction 211 in each pixel 10. The second direction 211 can be made different for each pixel 10 in the photoelectric conversion apparatus 500. For example, an angle in a direction 211-1 illustrated in FIG. 8A is advantageous for phase difference detection of a subject of which contrast changes in a horizontal direction, and an angle in a direction 211-4 illustrated in FIG. 8D is advantageous for phase difference detection of a subject of which contrast changes in a vertical direction. The separation direction of the photoelectric conversion region 206 is not limited to the vertical direction or the horizontal direction with respect to the arrangement direction of the plurality of pixels 10. The photoelectric conversion region 206 can be separated in an oblique direction with respect to the arrangement direction of the plurality of pixels 10, such as a direction 211-2 illustrated in FIG. 8B or a direction 211-3 illustrated in FIG. 8C.

The second direction 211 may not necessarily be the same among the plurality of pixels 10 in the photoelectric conversion apparatus 500. The plurality of pixels 10 different in the second direction 211 can be arranged in the photoelectric conversion apparatus 500. For example, four types of pixels illustrated in FIGS. 8A to 8D can be arranged in the photoelectric conversion apparatus 500.

In the above description, the direction in which each separation portion is formed is regarded as the separation direction of the corresponding photoelectric conversion region. Alternatively, for example, a surface that internally divides a line passing through the centers of gravity of the two photoelectric conversion regions in each layer can be defined as a separation surface, and a direction of a line where the separation surface and the layer intersect can be defined as the separation direction. Further alternatively, a direction of sides where the two photoelectric conversion regions in each layer are adjacent to each other can be defined as the separation direction.

Figure 9:
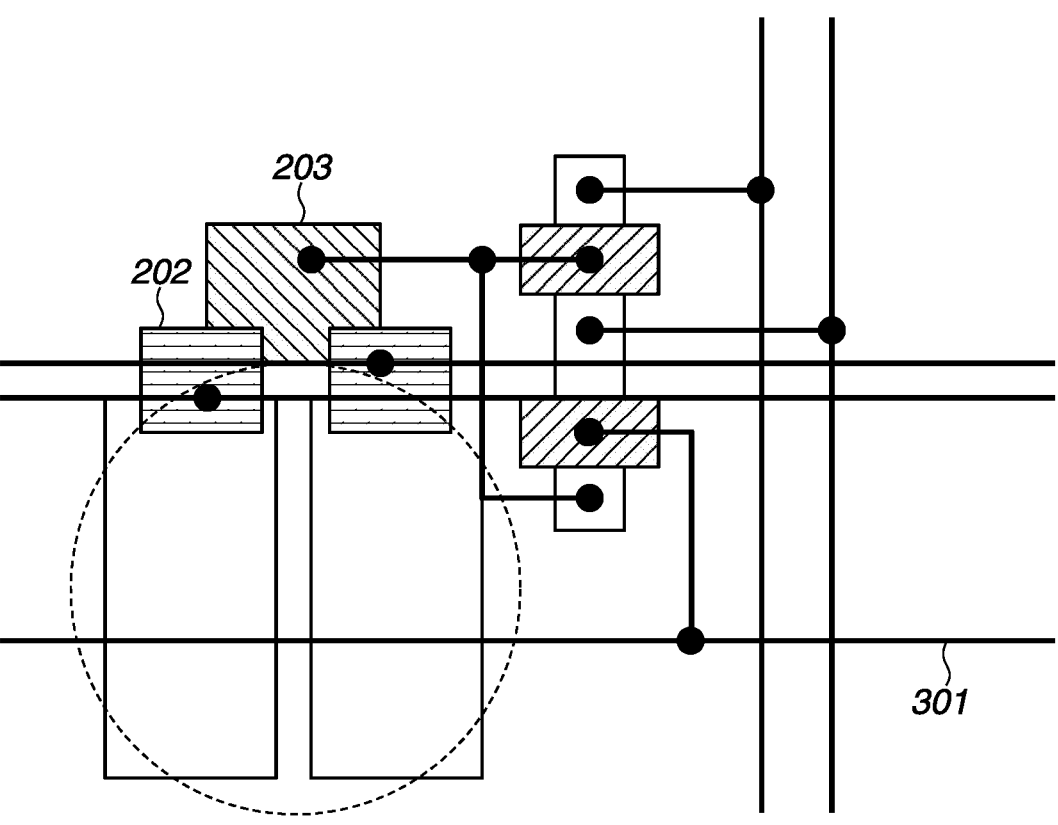
FIG. 9 is a schematic diagram of the pixel of the photoelectric conversion apparatus according to the first exemplary embodiment.
Figure 10A:
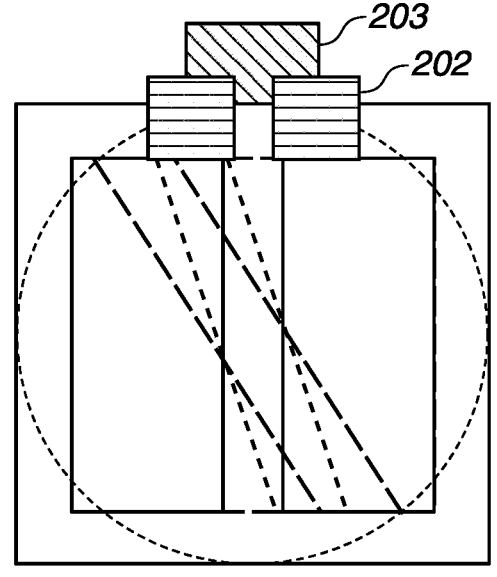
FIGS. 10A to 10D are plan views of a pixel of a photoelectric conversion apparatus according to a second exemplary embodiment.
Figure 10C:
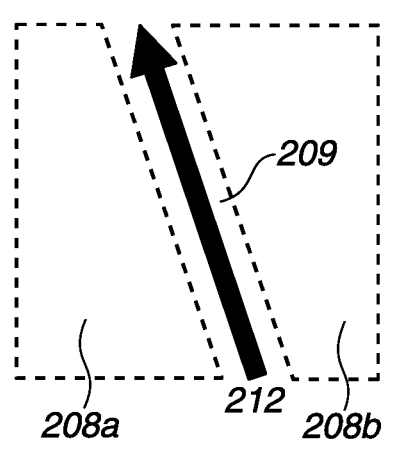
Figure 10B:
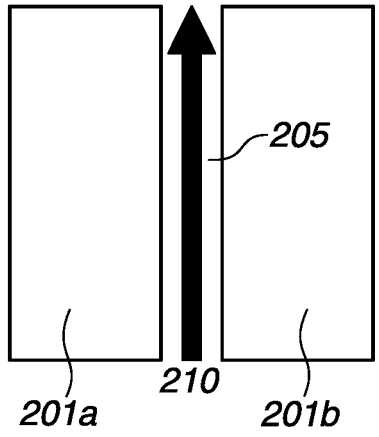
Figure 10D:
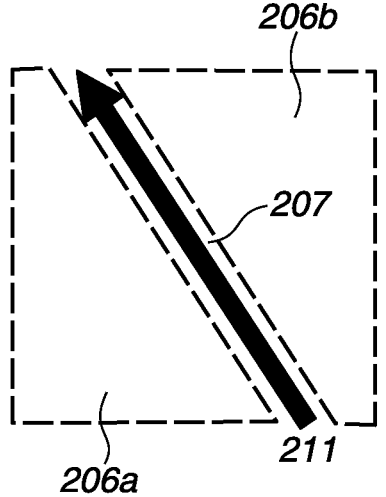

FIG. 9 is a schematic view including wiring 301 of the pixels 10 and the transistors arranged in each pixel 10. In the present exemplary embodiment, the first direction 210 is the same among the pixels 10.

In a case where a phase difference detection direction is to be made different for each pixel 10, for example, a method of rotating the entire pixel 10 based on a desired phase difference detection direction can be used. In a case where, for each pixel 10, the two photoelectric conversion units PDA and PDB under the microlens 204 are entirely rotated while aligning the directions of the substrate back surface side and the substrate front surface side for the purpose of phase difference detection in a plurality of directions, the photoelectric conversion region 201 on the substrate front surface side is arranged differently for each pixel 10. In other words, positions of the wiring 301 and the transistors are arranged differently for each pixel 10. This can cause, for example, a difference in capacitance of the FD 203 and result in a difference in pixel characteristics.

With the configuration according to the present exemplary embodiment, even in a case where the second direction 211 is made different for each pixel 10 for the purpose of phase difference detection in a plurality of directions, the photoelectric conversion region 201 can be arranged uniformly among the pixels 10. Thus, it is possible to suppress the difference in pixel characteristics due to the difference in pixel layout on the front surface side.

The present exemplary embodiment has been described above using the photoelectric conversion apparatus 500 including the pixels 10 of a backside incident type. Alternatively, front illuminated type pixels can be used. The present exemplary embodiment has been described above using the photoelectric conversion apparatus 500 in which a plurality of semiconductor substrates is laminated, but a photoelectric conversion apparatus in which pixels and circuits are formed in the same semiconductor substrate can be used.

A second exemplary embodiment of the disclosure will be described with reference to FIGS. 10A to 10D, 11A, and 11B. Components common between the first and second exemplary embodiments are denoted by the same reference numerals, and the descriptions thereof will be omitted.

The second exemplary embodiment is different from the first exemplary embodiment in that the third photoelectric conversion region 206*a* and the sixth photoelectric conversion region 208*b*, or the fourth photoelectric conversion region 206*b* and the fifth photoelectric conversion region 208*a* are arranged so as not to overlap each other in plan view. As with the photoelectric conversion regions 206 and 208, the photoelectric conversion regions 208 and 201 are arranged so that the photoelectric conversion regions "a" and photoelectric conversion regions "b" in the photoelectric conversion regions 208 and 201 do not overlap each other.

Figure 11A:
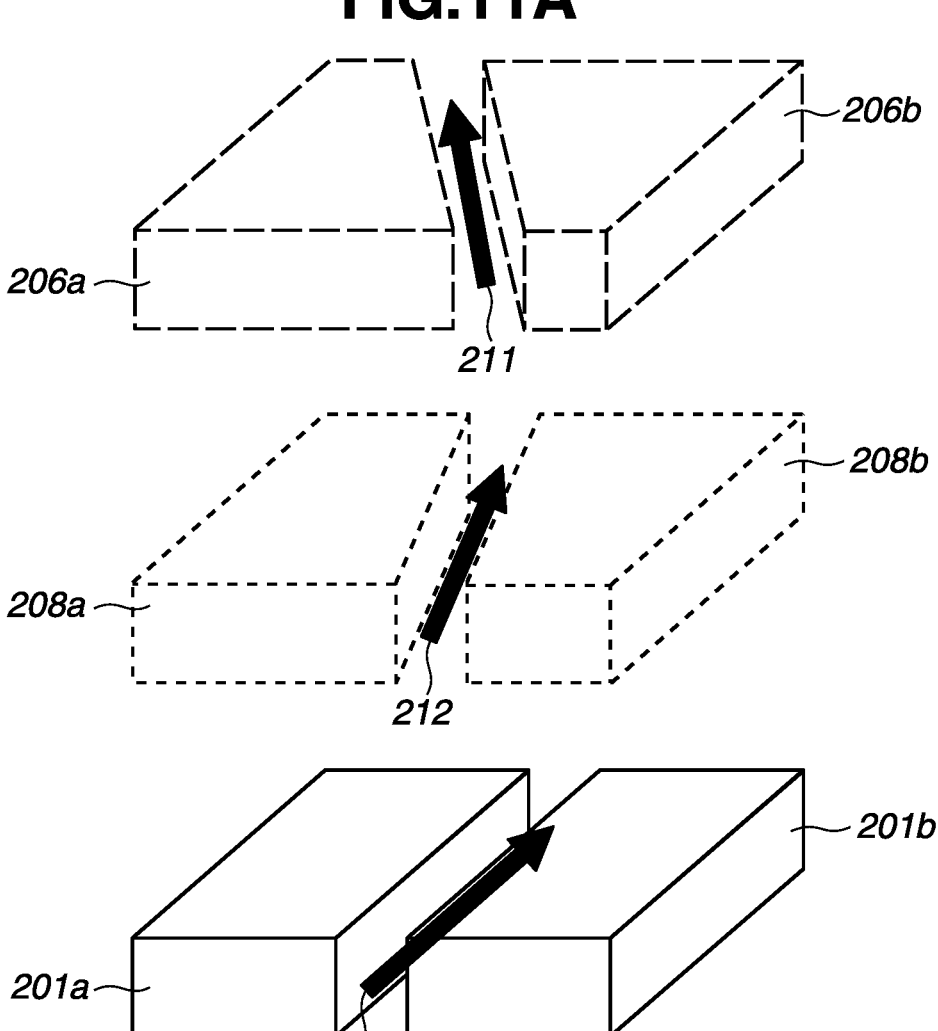
FIGS. 11A and 11B are schematic views illustrating each photoelectric conversion region of the pixel of the photoelectric conversion apparatus according to the second exemplary embodiment.
Figure 11B:
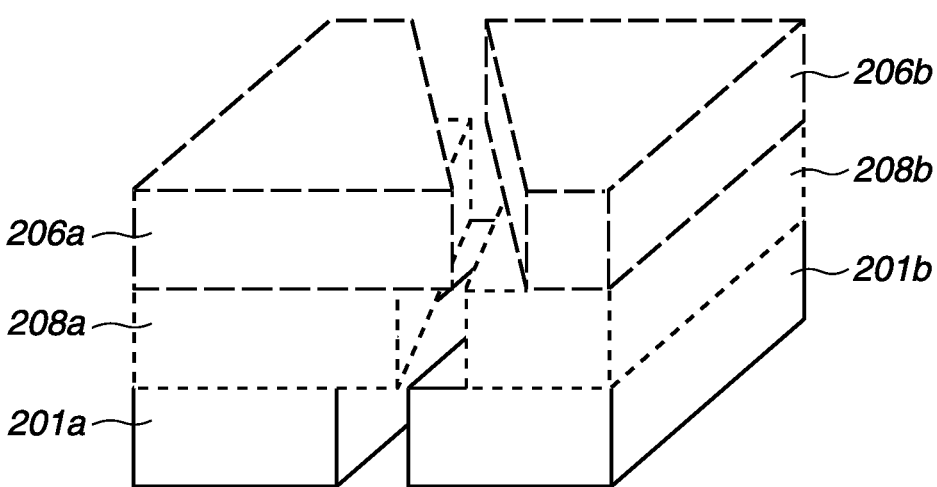
Figure 12A:
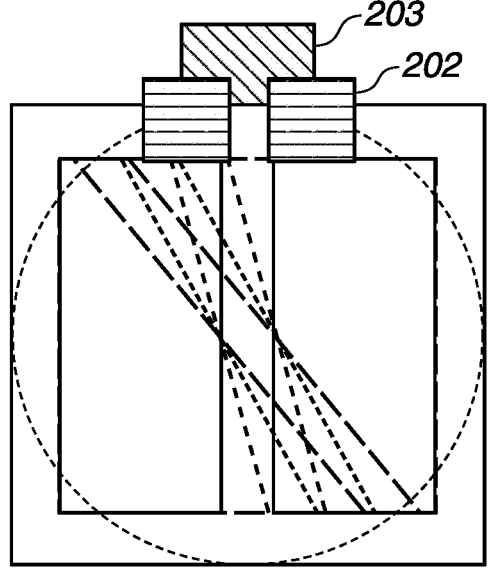
FIGS. 12A to 12E are plan views of a pixel of a photoelectric conversion apparatus according to a third exemplary embodiment.
Figure 12B:
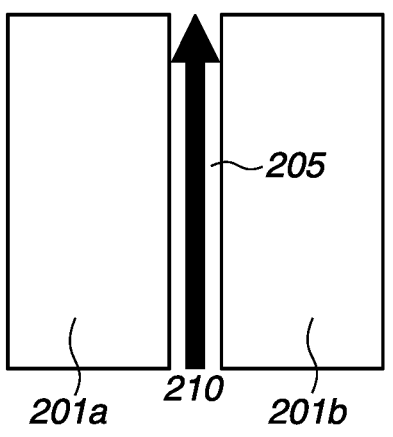
Figure 12C:
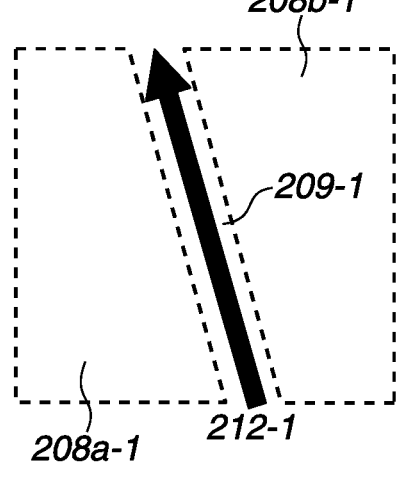
Figure 12D:
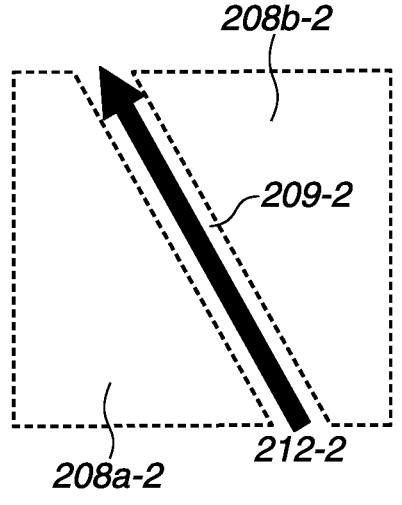
Figure 12E:
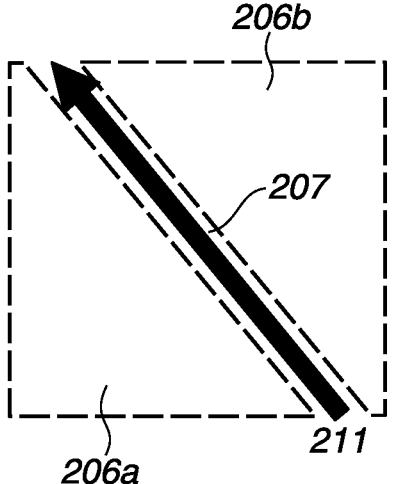

In the present exemplary embodiment, as illustrated in FIG. 11B, each pixel 10 has a structure in which the third photoelectric conversion region 206*a* and the sixth photoelectric conversion region 208*b* (or the fourth photoelectric conversion region 206*b* and the fifth photoelectric conversion region 208*a*) are not adjacent to each other.

If widths of the separation portions (the first separation portion 205, the second separation portion 207, and the third separation portion 209) are increased, the overlap between the photoelectric conversion regions "a" and the photoelectric conversion regions "b" can be reduced in plan view. However, increasing an area occupied by the separation portions in each pixel 10 reduces an area of the photoelectric conversion regions of the photodiodes, which has a disadvantage of reducing the charge amount that can be stored in the photodiodes. In one embodiment, the area of the separation portions in each pixel 10 is smaller than the area of the photoelectric conversion regions of the photodiodes.

Expressions "do not overlap each other in plan view" and "are not adjacent to each other" used in the descriptions of FIGS. 10A to 10D, 11A, and 11B also apply to cases other than a case where the N-type impurity does not exist at all between the third photoelectric conversion region 206*a* and the sixth photoelectric conversion region 208*b*. Examples of the cases include a case where potential with respect to the signal charge from the third photoelectric conversion region 206*a* to the sixth photoelectric conversion region 208*b* is formed higher than potential with respect to the signal charge from the third photoelectric conversion region 206*a* to the fifth photoelectric conversion region 208*a*. Examples of the cases also include a case where, if the signal charge is an electron, the N-type impurity concentration between the third photoelectric conversion region 206*a* and the sixth photoelectric conversion region 208*b* is lower than the N-type impurity concentration between the third photoelectric conversion region 206*a* and the fifth photoelectric conversion region 208*a*.

Not only the photoelectric conversion regions 206 and 208, but also the photoelectric conversion regions 208 and 201 have a relationship in which a similar potential difference is formed. With such a structure, charge crosstalk is less likely to occur between the photoelectric conversion regions "a" and the photoelectric conversion regions "b". In the present exemplary embodiment, the photoelectric conversion regions "a" are the first photoelectric conversion region 201a, the third photoelectric conversion region 206a, and the fifth photoelectric conversion region 208a, and the photoelectric conversion regions "b" are the second photoelectric conversion region 201b, the fourth photoelectric conversion region 206b, and the sixth photoelectric conversion region 208b.

Figures 13A, 13B:
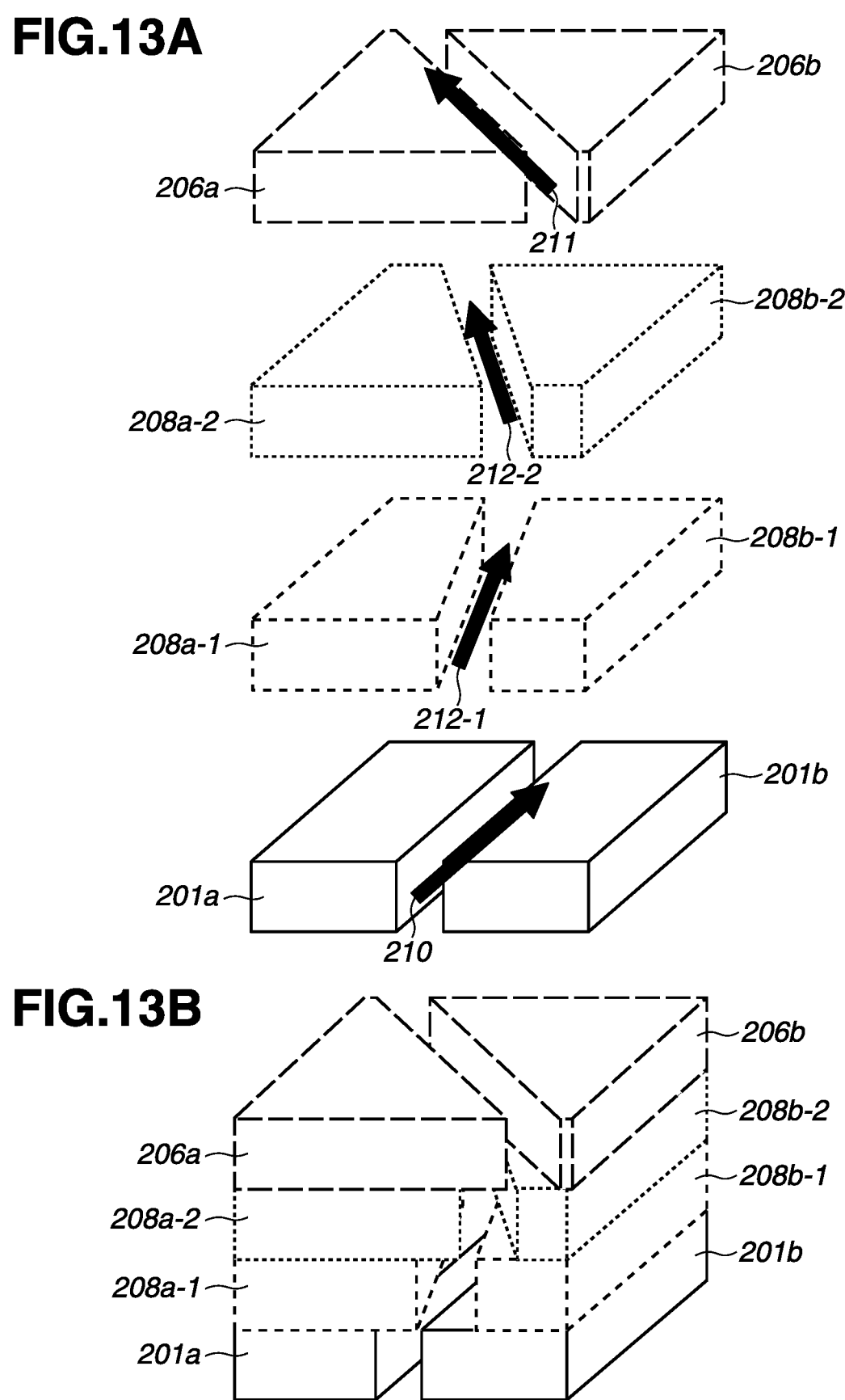
FIGS. 13A and 13B are schematic views illustrating each photoelectric conversion region of the pixel of the photoelectric conversion apparatus according to the third exemplary embodiment.
Figure 14A:
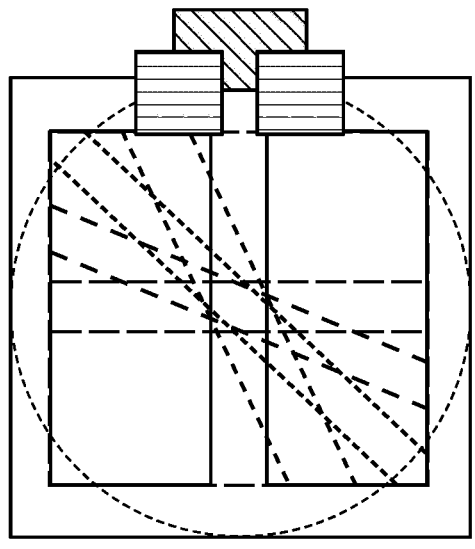
FIGS. 14A to 14F are plan views of a pixel of a photoelectric conversion apparatus according to a fourth exemplary embodiment.
Figure 14D:
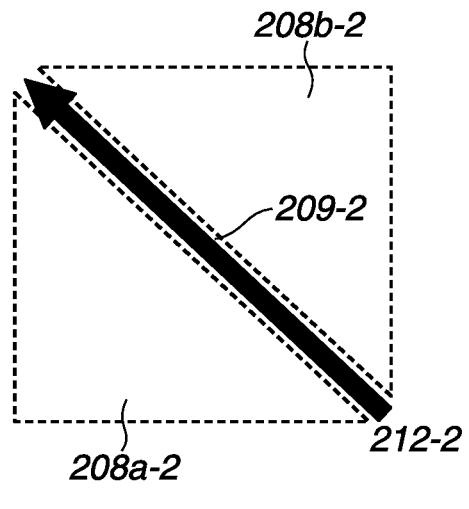
Figure 14B:
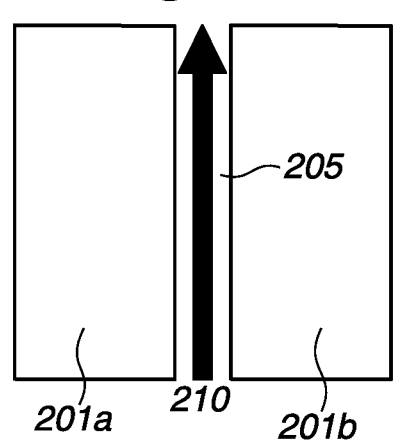
Figure 14E:
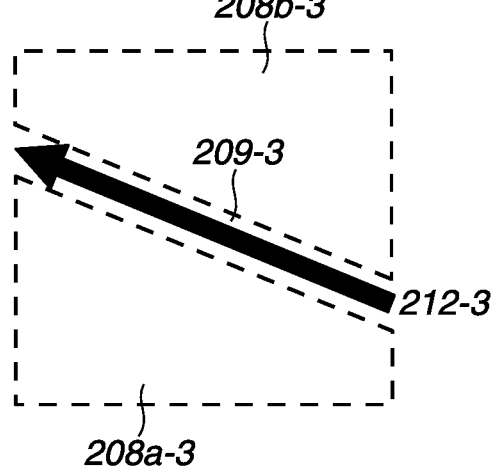
Figure 14C:
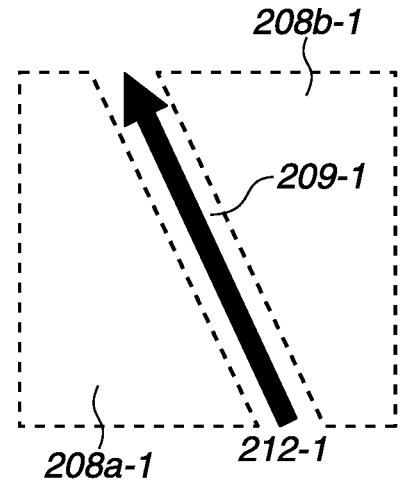
Figure 14F:
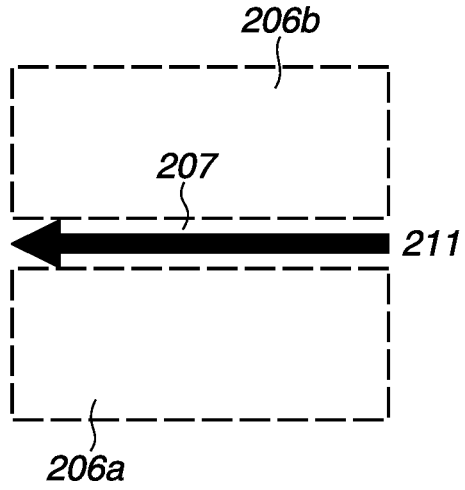

A third exemplary embodiment of the disclosure will be described with reference to FIGS. 12A to 12E, 13A, and 13B. FIGS. 12A to 12E are top schematic views of each pixel 10 according to the present exemplary embodiment, and FIGS. 13A and 13B are schematic views of the photoelectric conversion regions 201, 206, and 208 of each pixel 10 according to the present exemplary embodiment. The present exemplary embodiment is different from the first and second exemplary embodiments in that the photoelectric conversion region 208 has two layers.

More specifically, the photoelectric conversion region 208 according to the present exemplary embodiment is provided at the third depth and includes a fifth photoelectric conversion region 208a-1 and a sixth photoelectric conversion region 208b-1, which are separated by a third separation portion 209-1 extending in a third direction 212-1. The photoelectric conversion region 208 is also provided at a fourth depth between the second depth and the third depth and includes a seventh photoelectric conversion region 208a-2 and an eighth photoelectric conversion region 208b-2, which are separated by a fourth separation portion 209-2 extending in a fourth direction 212-2.

The photoelectric conversion region 208 having two layers can reduce an angle change in the separation direction between layers with respect to an angle change in the separation direction from the second direction 211 to the first direction 210. In other words, the photoelectric conversion region 208 having two layers can reduce the overlap of the photoelectric conversion regions "a" and the photoelectric conversion regions "b" between the layers compared with a case where the photoelectric conversion region 208 has one layer. As a result, the charge crosstalk between the photoelectric conversion regions "a" and the photoelectric conversion regions "b" can be further reduced, and the accuracy of phase difference detection can be improved.

The number of layers of the photoelectric conversion region 208 is not limited to two, and, for example, three or more layers of the photoelectric conversion region 208 can be formed.

A fourth exemplary embodiment of the disclosure will be described with reference to FIGS. 14A to 14F, 15A, and 15B.

Figure 15A:
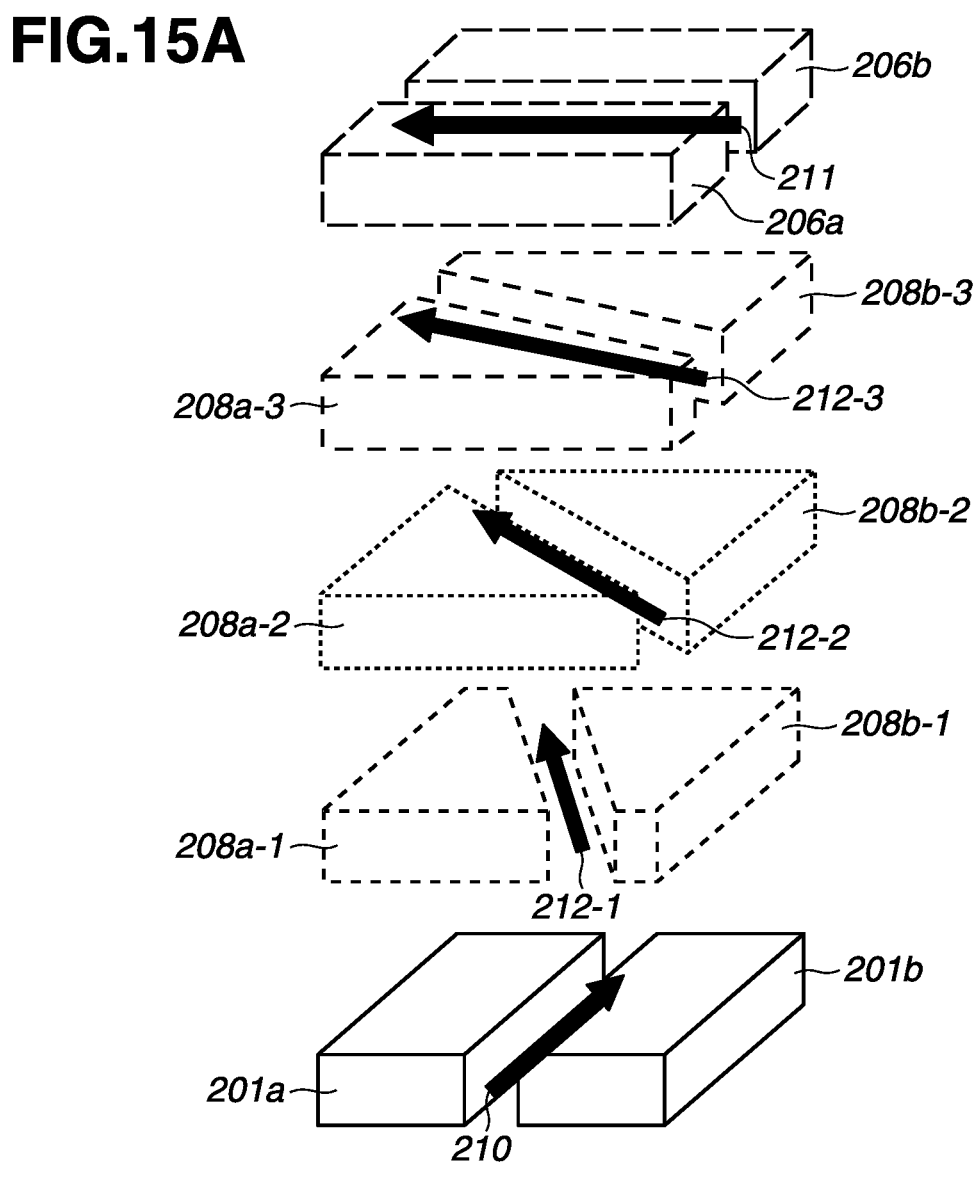
FIGS. 15A and 15B are schematic views illustrating each photoelectric conversion region of the pixel of the photoelectric conversion apparatus according to the fourth exemplary embodiment.
Figure 15B:
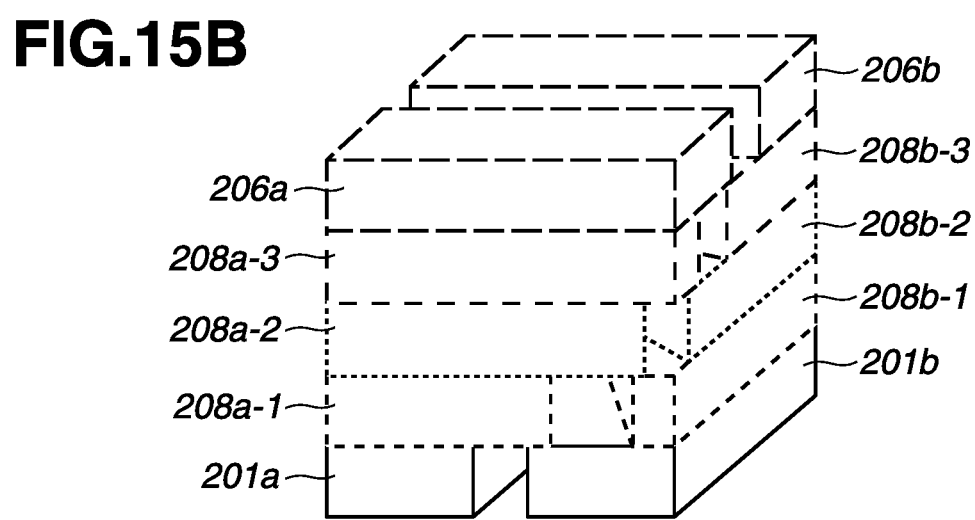

FIGS. 14A to 14F are top schematic views of each pixel 10 according to the present exemplary embodiment, and FIGS. 15A and 15B are schematic views of the photoelectric conversion regions 201, 206, and 208 of each pixel 10 according to the present exemplary embodiment.

The photoelectric conversion region 208 according to the present exemplary embodiment is provided at the third depth and includes the fifth photoelectric conversion region 208a-1 and the sixth photoelectric conversion region 208b-1, which are separated by the third separation portion 209-1 extending in the third direction 212-1. The photoelectric conversion region 208 is also provided at the fourth depth between the second depth and the third depth and includes the seventh photoelectric conversion region 208a-2 and the eighth photoelectric conversion region 208b-2, which are separated by the fourth separation portion 209-2 extending in the fourth direction 212-2.

The photoelectric conversion region 208 is further provided at a fifth depth between the second depth and the fourth depth and includes a ninth photoelectric conversion region 208a-3 and a tenth photoelectric conversion region 208b-3, which are separated by a fifth separation portion 209-3 extending in a fifth direction 212-3.

The present exemplary embodiment is different from the first to third exemplary embodiments in that a difference in separation angle between the photoelectric conversion regions 206 and 201 is 90 degrees. In the configurations according to the first to third exemplary embodiments, the second direction 211 and the first direction 210 obliquely intersect each other.

In the present exemplary embodiment, the photoelectric conversion regions 201, 206, and 208 are separated in such a manner that the second direction 211 and the first direction 210 are perpendicular to each other, and thus it is possible to improve the accuracy of phase difference detection of a subject of which contrast changes in the vertical direction.

Figure 16:
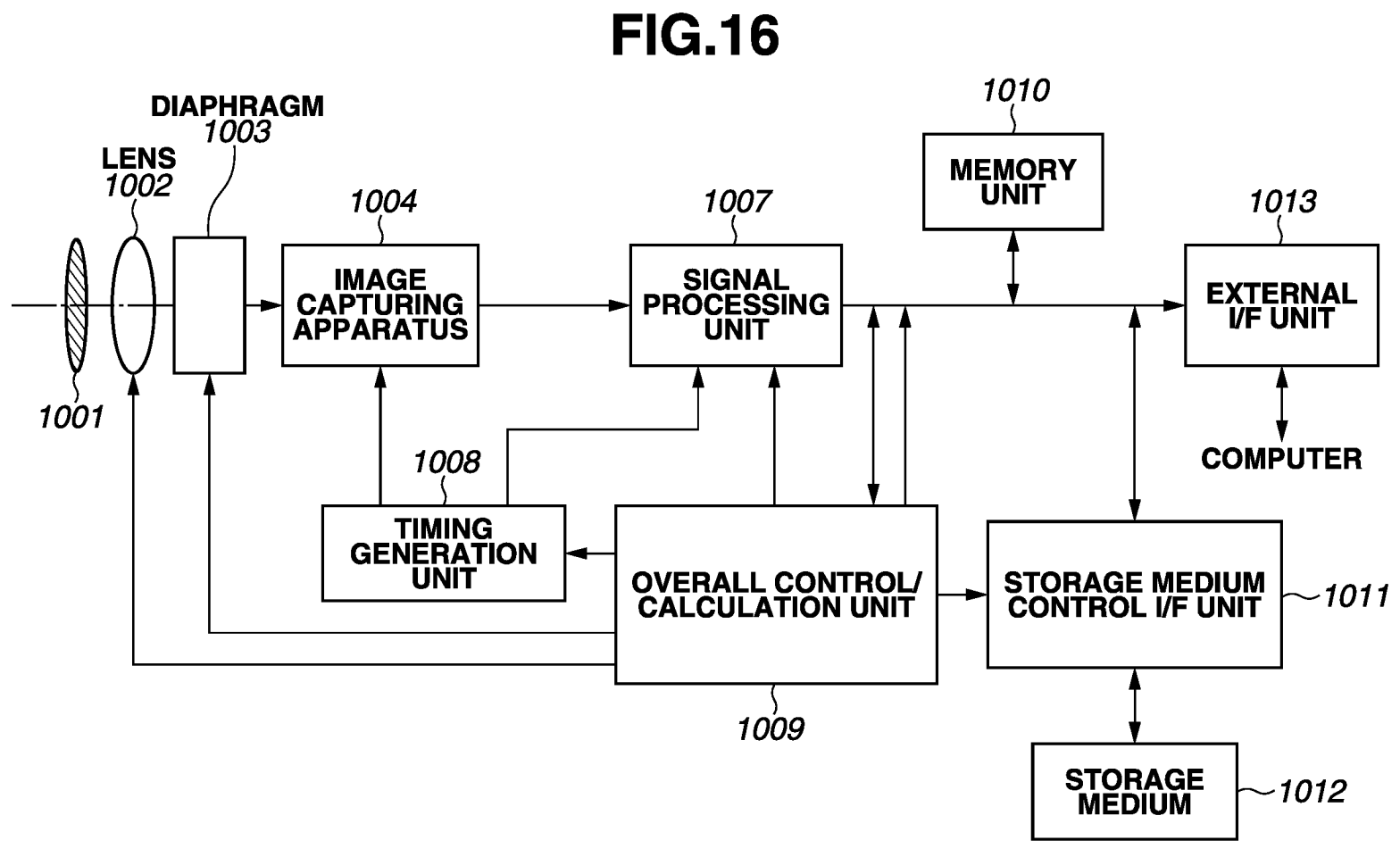

A photoelectric conversion system according to a fifth exemplary embodiment will be described with reference to FIG. 16. FIG. 16 is a block diagram illustrating a schematic configuration of the photoelectric conversion system according to the present exemplary embodiment.

The photoelectric conversion apparatuses according to the above-described first to fourth exemplary embodiments can be applied to various photoelectric conversion systems. Examples of the various photoelectric conversion systems include a digital still camera, a digital camcorder, a surveillance camera, a copying machine, a facsimile, a mobile phone, an on-vehicle camera, and an observation satellite. Examples of the various photoelectric conversion systems also include a camera module equipped with an optical system, such as a lens, and an image capturing apparatus. FIG. 16 is the block diagram of a digital still camera as an example of the photoelectric conversion systems. The photoelectric conversion system illustrated in FIG. 16 includes an image capturing apparatus 1004 as an example of a photoelectric conversion apparatus, and a lens 1002 for forming an optical image of a subject on the image capturing apparatus 1004. The photoelectric conversion system further includes a diaphragm 1003, which can change the amount of light passing through the lens 1002, and a barrier 1001 for protecting the lens 1002. The lens 1002 and the diaphragm 1003 serve as the optical system that condenses light onto the image capturing apparatus 1004. The image capturing apparatus 1004 is the photoelectric conversion apparatus according to any of the above-described exemplary embodiments and converts the optical image formed by the lens 1002 into an electrical signal.

The photoelectric conversion system also includes a signal processing unit 1007, which is an image generation unit that generates images by processing signals output from the image capturing apparatus 1004. The signal processing unit 1007 performs an operation of outputting image data by performing various corrections and compression as appropriate. The signal processing unit 1007 can be formed on the semiconductor substrate where the image capturing apparatus 1004 is provided or can be formed on a semiconductor substrate different from the semiconductor substrate where the image capturing apparatus 1004 is provided.

The photoelectric conversion system further includes a memory unit 1010 for temporarily storing the image data, and an external interface (I/F) unit 1013 for communicating with an external computer or the like. The photoelectric conversion system further includes a storage medium 1012, such as a semiconductor memory, for storing or reading imaging data and a storage medium control interface (I/F) unit 1011 for storing and reading the imaging data on the storage medium 1012. The storage medium 1012 can be built into or detachably attached to the photoelectric conversion system.

The photoelectric conversion system further includes an overall control/calculation unit 1009 that performs various calculations and controls the entire digital still camera, and a timing generation unit 1008 that outputs various timing signals to the image capturing apparatus 1004 and the signal processing unit 1007. The timing signals can be input from the outside, and the photoelectric conversion system includes at least the image capturing apparatus 1004 and the signal processing unit 1007 that processes the signals output from the image capturing apparatus 1004.

The image capturing apparatus 1004 outputs an imaging signal to the signal processing unit 1007. The signal processing unit 1007 performs predetermined signal processing on the imaging signal output from the image capturing apparatus 1004 and outputs image data. The signal processing unit 1007 generates an image using the imaging signal.

As described above, according to the present exemplary embodiment, the photoelectric conversion system to which the photoelectric conversion apparatus (the image capturing apparatus) according to any of the above-described exemplary embodiments is applied can be implemented.

Figure 17A:
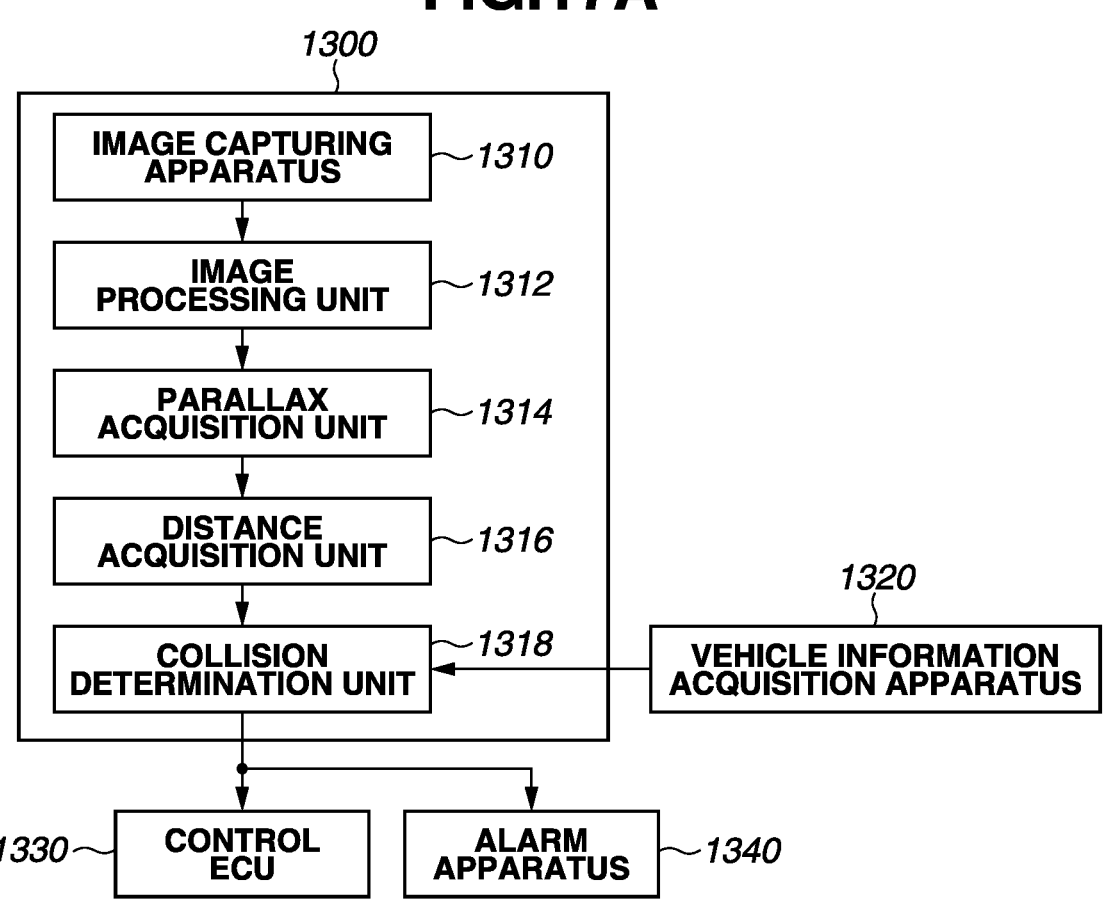
FIGS. 17A and 17B are functional block diagrams illustrating a photoelectric conversion system according to a sixth exemplary embodiment.
Figure 17B:
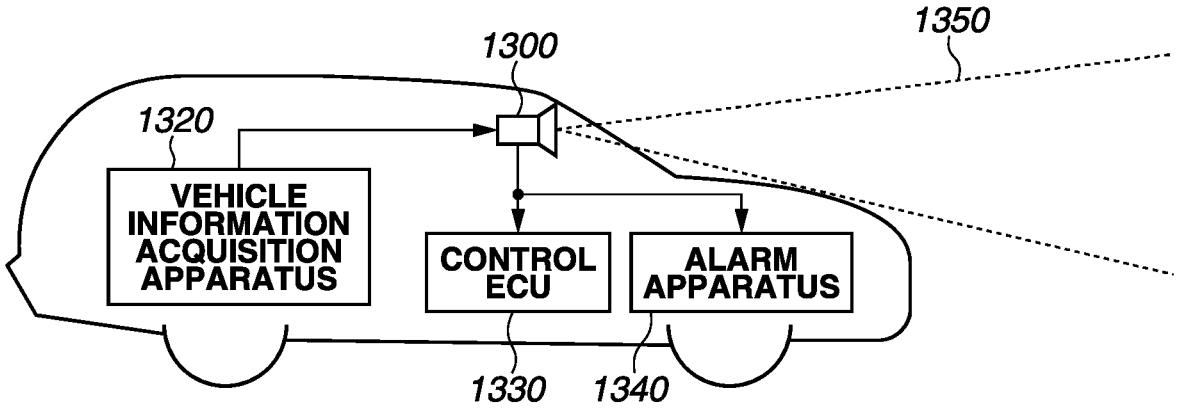

A photoelectric conversion system and a moving body according to a sixth exemplary embodiment will be described with reference to FIGS. 17A and 17B. FIGS. 17A and 17B illustrate configurations of the photoelectric conversion system and the moving body according to the present exemplary embodiment.

FIG. 17A illustrates an example of a photoelectric conversion system 1300 for an on-vehicle camera. The photoelectric conversion system 1300 includes an image capturing apparatus 1310. The image capturing apparatus 1310 is the photoelectric conversion apparatus according to any of the above-described exemplary embodiments. The photoelectric conversion system 1300 also includes an image processing unit 1312 that performs image processing on a plurality of pieces of image data acquired by the image capturing apparatus 1310, and a parallax acquisition unit 1314 that calculates parallax (a phase difference between parallax images) from the plurality of pieces of image data acquired by the photoelectric conversion system 1300. The photoelectric conversion system 1300 also includes a distance acquisition unit 1316 that calculates a distance to a subject based on the calculated parallax, and a collision determination unit 1318 that determines whether there is a possibility of collision based on the calculated distance. The parallax acquisition unit 1314 and the distance acquisition unit 1316 are examples of a distance information acquisition unit that acquires distance information about a distance to a subject. In other words, the distance information is information about parallax, a defocus amount, a distance to a subject, and the like. The collision determination unit 1318 can use any of the distance information to determine the possibility of collision. The distance information acquisition unit can be implemented by specifically designed hardware or a software module.

The distance information acquisition unit can also be implemented by a field programmable gate array (FPGA), an application specific integrated circuit (ASIC), or a combination thereof.

The photoelectric conversion system 1300 is connected to a vehicle information acquisition apparatus 1320 and can acquire vehicle information such as a vehicle speed, a yaw rate, and a steering angle. The photoelectric conversion system 1300 is also connected to a control engine control unit (ECU) 1330, which is a control unit that outputs a control signal for generating a braking force to the vehicle based on a determination result by the collision determination unit 1318. The photoelectric conversion system 1300 is also connected to an alarm apparatus 1340 that issues an alarm to a driver based on the determination result by the collision determination unit 1318. For example, if there is a high possibility of collision based on the determination result by the collision determination unit 1318, the control ECU 1330 controls the vehicle to avoid collision and reduce damage, for example, by applying a brake, releasing an accelerator, and suppressing an engine output. The alarm apparatus 1340 warns a user by sounding an alarm, displaying alarm information on a screen of a car navigation system or the like, and vibrating a seatbelt or a steering wheel.

In the present exemplary embodiment, the photoelectric conversion system 1300 captures an image of the surroundings, for example, the front or back of the vehicle. FIG. 17B illustrates the photoelectric conversion system 1300 in a case where an image of the front of the vehicle (an imaging range 1350) is captured. The vehicle information acquisition apparatus 1320 transmits an instruction to the photoelectric conversion system 1300 or the image capturing apparatus 1310. Such a configuration can further improve distance measurement accuracy.

While the example of controlling the vehicle so as not to collide with another vehicle has been described above, the present exemplary embodiment can also be applied to control for automatically driving a vehicle following another vehicle and control for automatically driving a vehicle so as not to stray from a lane. Further, the photoelectric conversion system can be applied not only to a vehicle such as an automobile, but also to a moving body (a moving apparatus) such as a ship, an aircraft, or an industrial robot. The photoelectric conversion system can also be applied not only to a moving body but also a device that widely uses object recognition, such as an intelligent transportation system (ITS).

Figure 18:
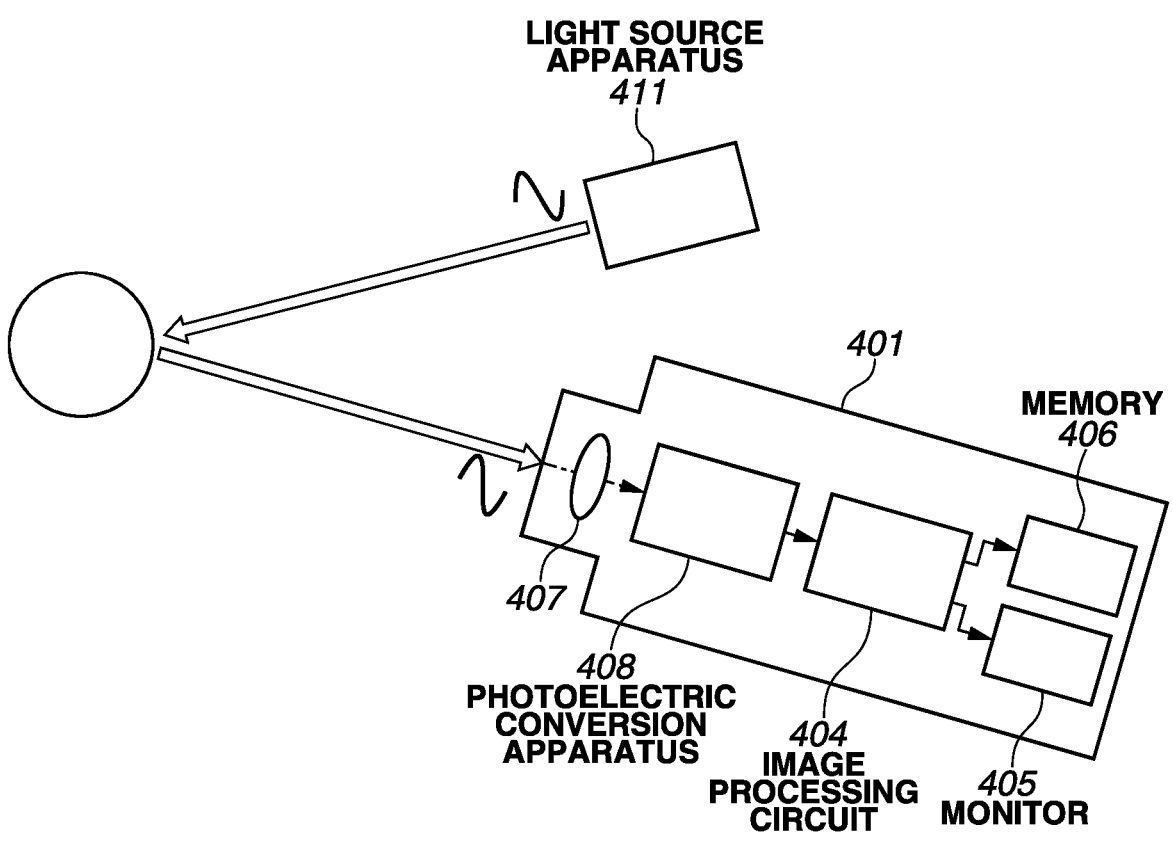
FIG. 18 is a functional block diagram illustrating a photoelectric conversion system according to a seventh exemplary embodiment.

A photoelectric conversion system according to a seventh exemplary embodiment will be described with reference to FIG. 18. FIG. 18 is a block diagram illustrating a configuration example of a distance image sensor 401 that is the photoelectric conversion system according to the present exemplary embodiment.

As illustrated in FIG. 18, the distance image sensor 401 includes an optical system 407, a photoelectric conversion apparatus 408, an image processing circuit 404, a monitor 405, and a memory 406. The distance image sensor 401 receives light (modulated light or pulsed light) that is projected from a light source apparatus 411 toward a subject and reflected from a surface of the subject and thus can acquire a distance image corresponding to a distance to the subject.

The optical system 407 includes one or more lenses, guides image light (incident light) from the subject to the photoelectric conversion apparatus 408, and forms an image on a light receiving surface (a sensor unit) of the photoelectric conversion apparatus 408.

As the photoelectric conversion apparatus 408, the photoelectric conversion apparatus according to any of the above-described exemplary embodiments is applied, and a distance signal indicating a distance obtained from a received light signal output from the photoelectric conversion apparatus 408 is supplied to the image processing circuit 404.

The image processing circuit 404 performs image processing for constructing the distance image based on the distance signal supplied from the photoelectric conversion apparatus 408. Then, the distance image (the image data) obtained by the image processing is supplied to the monitor 405 to be displayed or is supplied to the memory 406 to be stored (recorded).

Any of the above-described photoelectric conversion apparatuses is applied to the distance image sensor 401 having such a configuration, whereby, for example, a more accurate distance image can be acquired with the improvement of the pixel characteristics.

Figure 19:
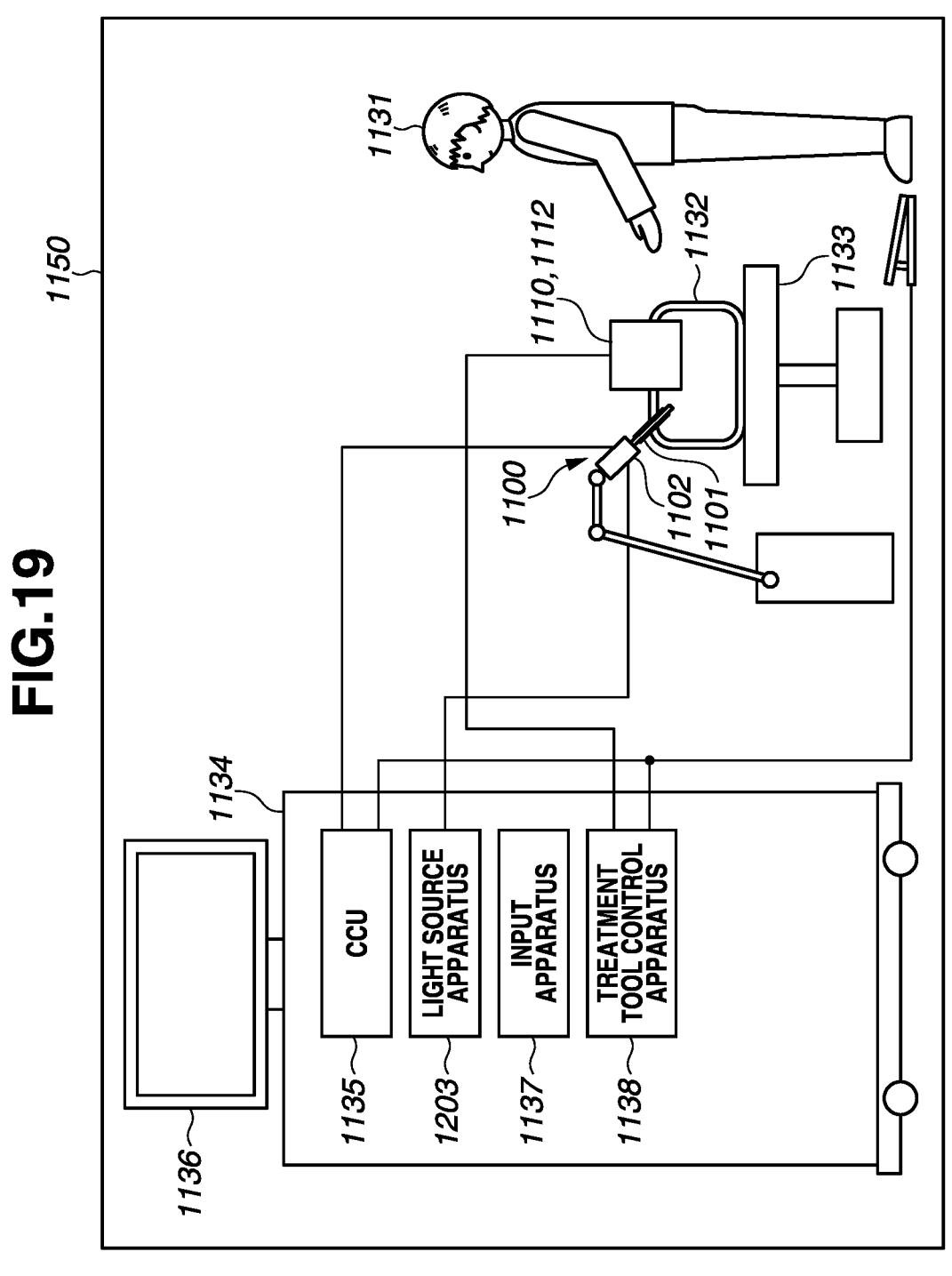
FIG. 19 is a functional block diagram illustrating a photoelectric conversion system according to an eighth exemplary embodiment.

A photoelectric conversion system according to an eighth exemplary embodiment will be described with reference to FIG. 19. FIG. 19 illustrates an example of a schematic configuration of an endoscopic surgery system 1150 that is the photoelectric conversion system according to the present exemplary embodiment.

FIG. 19 illustrates an operator (a doctor) 1131 performing surgery on a patient 1132 on a patient bed 1133 using the endoscopic surgery system 1150. As illustrated in FIG. 19, the endoscopic surgery system 1150 includes an endoscope 1100, a surgical tool 1110, and a cart 1134 loaded with various apparatuses for endoscopic surgery.

The endoscope 1100 includes a lens barrel 1101 and a camera head 1102. The lens barrel 1101 has a region of a predetermined length from its distal end, which is to be inserted into a body cavity of the patient 1132. The camera head 1102 is connected to a base end of the lens barrel 1101. In the illustrated example, the endoscope 1100 as a rigid scope including the lens barrel 1101 having rigidity is illustrated, but the endoscope 1100 can be a flexible scope having a flexible lens barrel.

The distal end of the lens barrel 1101 is provided with an opening portion into which an objective lens is fitted. The endoscope 1100 is connected to a light source apparatus 1203. Light generated by the light source apparatus 1203 is guided to the distal end of the lens barrel 1101 by a light guide extending inside the lens barrel 1101, and is emitted toward an observation target inside the body cavity of the patient 1132 through the objective lens. The endoscope 1100 can be a forward-viewing, oblique-viewing, or side-viewing endoscope.

An optical system and a photoelectric conversion apparatus are provided inside the camera head 1102, and reflected light (observation light) from the observation target is collected by the optical system into the photoelectric conversion apparatus. The observation light is photoelectrically converted by the photoelectric conversion apparatus to generate an electrical signal corresponding to the observation light, i.e., an image signal corresponding to an observation image. As the photoelectric conversion apparatus, the photoelectric conversion apparatus according to any of the above-described exemplary embodiments can be used. The image signal is transmitted as RAW data to a camera control unit (CCU) 1135.

The CCU 1135 includes a central processing unit (CPU), a graphics processing unit (GPU), or the like and comprehensively controls operations of the endoscope 1100 and a display apparatus 1136. The CCU 1135 also receives the image signal from the camera head 1102 and performs various types of image processing, such as development processing (demosaicing), on the image signal to display an image based on the image signal.

The display apparatus 1136 displays the image based on the image signal processed by the CCU 1135, under the control of the CCU 1135.

The light source apparatus 1203 includes a light source, such as a light emitting diode (LED), and supplies the endoscope 1100 with irradiation light for capturing an image of a surgical site or the like.

An input apparatus 1137 is an input interface for the endoscopic surgery system 1150. A user can input various pieces of information and instructions to the endoscopic surgery system 1150 via the input apparatus 1137.

A treatment tool control apparatus 1138 controls driving of an energy treatment tool 1112 for tissue cauterization, incision, blood vessel sealing, or the like.

The light source apparatus 1203, which supplies the endoscope 1100 with irradiation light for capturing an image of the surgical site, can include, for example, a white light source such as an LED, a laser light source, or a combination thereof. In a case where the white light source is a combination of red, green, and blue (RGB) laser light sources, output intensity and output timing of each color (each wavelength) can be highly accurately controlled, whereby the light source apparatus 1203 can adjust a white balance of a captured image. In this case, the observation target is irradiated with laser light from each of the RGB laser light sources in a time division manner, and driving of an image sensor of the camera head 1102 is controlled in synchronization with the irradiation timing, whereby an image corresponding to each of the RGB laser light sources can be captured in a time division manner. According to this method, a color image can be acquired without providing a color filter in the image sensor.

Driving of the light source apparatus 1203 can be controlled so as to change output light intensity at predetermined time intervals. Driving of the image sensor of the camera head 1102 is controlled in synchronization with the timing of changing the light intensity to acquire images in a time division manner, and the acquired images are combined, whereby a high dynamic range image without underexposure and overexposure can be generated.

The light source apparatus 1203 can be configured to supply light in a predetermined wavelength band corresponding to special light observation. Special light observation utilizes, for example, wavelength dependency of light absorption in a body tissue. More specifically, an image of a predetermined tissue such as a blood vessel in a mucous membrane surface layer is captured with high contrast by irradiating the tissue with light with a narrow band compared with irradiation light (i.e., white light) used in normal observation.

Alternatively, in special light observation, fluorescence observation can be performed in which an image is acquired using fluorescence generated by irradiation with excitation light. In fluorescence observation, it is possible to observe fluorescence from a body tissue by irradiating the body tissue with the excitation light, or to acquire a fluorescent image by locally injecting a reagent such as indocyanine green (ICG) into a body tissue and irradiating the body tissue with the excitation light corresponding to the fluorescence wavelength of the reagent. The light source apparatus 1203 can be configured to supply narrow band light and/or excitation light corresponding to such special light observation.

Figure 20A:
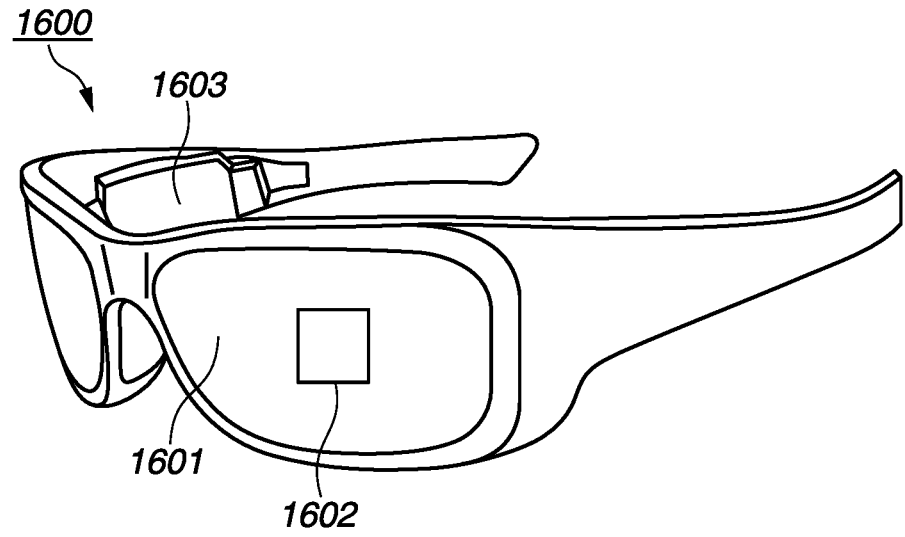
FIGS. 20A and 20B are external views illustrating a photoelectric conversion system according to a ninth exemplary embodiment.

A photoelectric conversion system according to a ninth exemplary embodiment will be described with reference to FIGS. 20A and 20B. FIG. 20A illustrates eye glasses (smart glasses) 1600 that are the photoelectric conversion system according to the present exemplary embodiment. The eye glasses 1600 include a photoelectric conversion apparatus 1602. The photoelectric conversion apparatus 1602 is the photoelectric conversion apparatus according to any of the above-described exemplary embodiments. A display apparatus including a light-emitting device such as an organic LED (OLED) or an LED can be provided on a back surface side of a lens 1601. The photoelectric conversion apparatus 1602 can be provided singularly or in plural. A plurality of types of the photoelectric conversion apparatus 1602 can also be used in combination. An arrangement position of the photoelectric conversion apparatus 1602 is not limited to that in FIG. 20A.

The eye glasses 1600 also include a control apparatus 1603. The control apparatus 1603 functions as a power supply that supplies power to the photoelectric conversion apparatus 1602 and the above-described display apparatus. The control apparatus 1603 also controls operations of the photoelectric conversion apparatus 1602 and the display apparatus. The lens 1601 forms an optical system to condense light into the photoelectric conversion apparatus 1602.

Figure 20B:
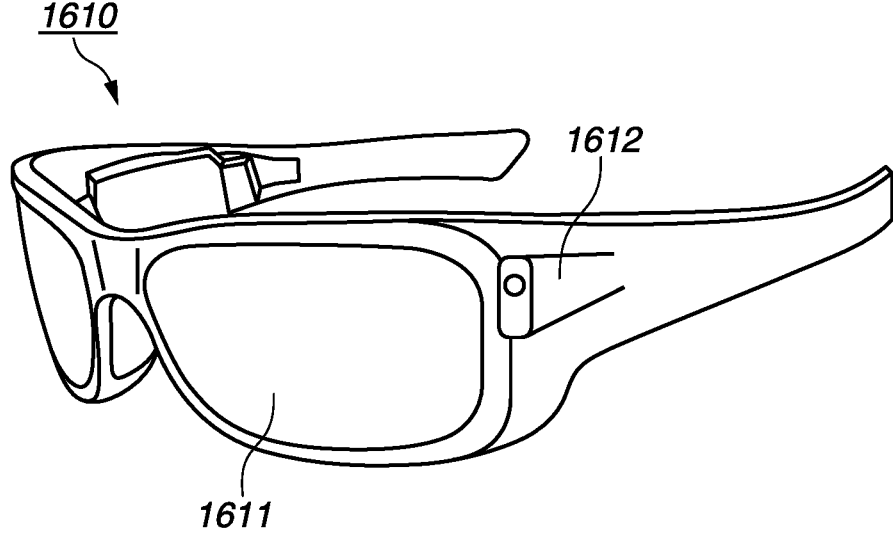

FIG. 20B illustrates eye glasses (smart glasses) 1610 according to one application example. The eye glasses 1610 include a control apparatus 1612, and the control apparatus 1612 is equipped with a photoelectric conversion apparatus 1612 corresponding to the photoelectric conversion apparatus 1602 and a display apparatus. The photoelectric conversion apparatus in the control apparatus 1612 and an optical system for projecting light emitted from the display apparatus are formed in a lens 1611, and an image is projected onto the lens 1611. The control apparatus 1612 functions as a power supply that supplies power to the photoelectric conversion apparatus and the display apparatus and also controls operations of the photoelectric conversion apparatus and the display apparatus. The control apparatus 1612 can include a line-of-sight detection unit that detects the line of sight of a wearer. Infrared light can be used for line-of-sight detection. An infrared light emitting unit emits infrared light to an eyeball of a user who is gazing at a displayed image. An image capturing unit including a light receiving element detects the infrared light emitted to the eyeball and reflected therefrom, whereby a captured image of the eyeball is acquired. A reduction unit that reduces the light from the infrared light emitting unit to the display unit in plan view is provided, whereby deterioration of image quality is reduced.

The line of sight of the user towards the displayed image is detected from the captured image of the eyeball acquired by the imaging using the infrared light. Any known method can be applied to the line-of-sight detection using the captured image of the eyeball. As an example thereof, a line-of-sight detection method based on a Purkinje image obtained by reflection of irradiation light on a cornea can be used.

More specifically, line-of-sight detection processing based on a pupil-corneal reflection method is performed. The line of sight of the user is detected by calculating a line-of-sight vector representing an orientation (a rotational angle) of the eyeball based on a pupil image and a Purkinje image included in the captured image of the eyeball using the pupil-corneal reflection method.

The display apparatus according to the present exemplary embodiment can include the photoelectric conversion apparatus including a light receiving element and control a displayed image on the display apparatus based on line-of-sight information about the user from the photoelectric conversion apparatus.

More specifically, the display apparatus determines, based on the line-of-sight information, a first visual field area that the user gazes at and a second visual field area other than the first visual field area. The first visual field area and the second visual field area can be determined by a control apparatus of the display apparatus, or can be determined by an external control apparatus and received therefrom. Display resolution of the first visual field area can be controlled to be higher than display resolution of the second visual field area in a display area of the display apparatus. In other words, the resolution of the second visual field area can be set to be lower than that of the first visual field area.

The display area can include a first display area and a second display area different from the first display area, and a high priority area can be determined from the first display area and the second display area based on the line-of-sight information. The first display area and the second display area can be determined by the control apparatus of the display apparatus, or can be determined by the external control apparatus and received therefrom. The resolution of the high priority area can be controlled to be higher than the resolution of the area other than the high priority area. In other words, the resolution of a relatively low priority area can be lowered.

Artificial intelligence (AI) can be used to determine the first visual field area and the high priority area. The AI can be a model configured to use an image of an eyeball and a direction in which the eyeball in the image actually looks at as teacher data and to estimate a line-of-sight angle and a distance to an object beyond the line of sight from the image of the eyeball. An AI program can be included in the display apparatus, the photoelectric conversion apparatus, or an external apparatus. In a case where the external apparatus includes the AI program, the AI program is transmitted to the display apparatus via communication.

In the case of performing display control based on visual recognition detection, the present exemplary embodiment can be applied to smart glasses further including a photoelectric conversion apparatus that captures an image of the outside. The smart glasses can display information about the captured image of the outside in real time.

Exemplary embodiments of the disclosure are not limited to the above-described exemplary embodiments and the above-described exemplary embodiments can be modified in various ways. For example, examples in which a part of the configuration according to any of the exemplary embodiments is added to the configuration according to any other exemplary embodiment or is replaced with a part of the configuration according to any other exemplary embodiment can be included in the exemplary embodiments of the disclosure.

The photoelectric conversion systems according to the above-described fifth and sixth exemplary embodiments are merely examples of the photoelectric conversion system to which the photoelectric conversion apparatus according to any of the exemplary embodiments of the disclosure can be applied, and the photoelectric conversion system to which the photoelectric conversion apparatus according to any of the exemplary embodiments can be applied is not limited to the configurations illustrated in FIGS. 16, 17A, and 17B. The same applies to the distance image sensor according to the seventh exemplary embodiment, the endoscopic surgery system according to the eighth exemplary embodiment, and the smart glasses according to the ninth exemplary embodiment.

The above-described exemplary embodiments merely describe examples for implementing the disclosure, and the technical scope of the disclosure should not be construed to be limited by the exemplary embodiments. The exemplary embodiments of the disclosure can be implemented in various forms without departing from the technical idea or main features thereof.

According to the exemplary embodiments of the disclosure, it is possible to prevent a decrease in accuracy of phase difference detection of a photoelectric conversion apparatus.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-086972, filed May 27, 2022, which is hereby incorporated by reference herein in its entirety.

What is claimed is:

1. An apparatus comprising:
a plurality of pixels each including a plurality of photoelectric conversion regions provided in a layer and a microlens,
wherein the layer has a first depth, a second depth, and a third depth between the first depth and the second depth in order from a side of a surface of the layer that faces a surface of the layer on which the microlens is formed,
wherein the layer includes:
a first separation portion that separates the plurality of photoelectric conversion regions at the first depth and extends in a first direction,
a second separation portion that separates the plurality of photoelectric conversion regions at the second depth and extends in a second direction, and
a third separation portion that separates the plurality of photoelectric conversion regions at the third depth and extends in a third direction, and
wherein an angle that is formed by the first separation portion and the third separation portion is smaller than an angle that is formed by the first separation portion and the second separation portion, wherein each angle is less than or equal to 90 degrees, and
a fourth separation portion that separates the plurality of photoelectric conversion regions at a fourth depth between the second depth and the third depth and extends in a fourth direction.

2. The apparatus according to claim 1,
wherein an angle that is formed by the first separation portion and the fourth separation portion is smaller than the angle that is formed by the first separation portion and the second separation portion, wherein each angle is less than or equal to 90 degrees.

3. The apparatus according to claim 2, wherein the angle that is formed by the first separation portion and the fourth separation portion is greater than the angle that is formed by the first separation portion and the third separation portion, wherein each angle is less than or equal to 90 degrees.

4. The apparatus according to claim 1,
wherein the plurality of photoelectric conversion regions includes a first region and a second region that are separated by the first separation portion, and a third region and a fourth region that are separated by the third separation portion, and
wherein, in a plan view, the first region and the third region overlap each other, and the first region and the fourth region do not overlap each other.

5. The apparatus according to claim 1,
wherein the plurality of photoelectric conversion regions includes a first region and a second region that are separated by the first separation portion, and a third region and a fourth region that are separated by the third separation portion, and
wherein a potential difference between the first region and the third region is less than a potential difference between the first region and the fourth region.

6. The apparatus according to claim 1,
wherein the plurality of photoelectric conversion regions includes a first region and a second region that are separated by the first separation portion, and
wherein potential of the first separation portion with respect to a signal charge generated in the plurality of photoelectric conversion regions is higher than potential of the first region and the second region with respect to the signal charge.

7. The apparatus according to claim 1,
wherein each of the plurality of photoelectric conversion regions is a trapezoidal region, and
wherein, among the plurality of photoelectric conversion regions, a first region and a second region that are separated by the first separation portion are rectangular regions in which the first separation portion is arranged along a longitudinal direction thereof.

8. The apparatus according to claim 1, wherein the first separation portion is provided along a surface that internally divides a line passing through a center of gravity of the plurality of photoelectric conversion regions in each of the plurality of pixels.

9. The apparatus according to claim 1, wherein, among the plurality of photoelectric conversion regions, a region at the second depth and a region at the third depth have a same conductivity type.

10. The apparatus according to claim 5, wherein an area of the first separation portion is smaller than an area of the first region.

11. A system comprising:
the apparatus according to claim 1; and
a signal processing unit configured to generate an image using a signal output from the apparatus.

12. The system according to claim 11,
wherein an angle that is formed by the first separation portion and the fourth separation portion is smaller than the angle that is formed by the first separation portion and the second separation portion, wherein each angle is less than or equal to 90 degrees.

13. The system according to claim 11,
wherein the plurality of photoelectric conversion regions includes a first region and a second region that are separated by the first separation portion, and a third region and a fourth region that are separated by the third separation portion, and
wherein, in a plan view, the first region and the third region overlap each other, and the first region and the fourth region do not overlap each other.

14. The system according to claim 11,
wherein the plurality of photoelectric conversion regions includes a first region and a second region that are separated by the first separation portion, and a third region and a fourth region that are separated by the third separation portion, and
wherein a potential difference between the first region and the third region is less than a potential difference between the first region and the fourth region.

15. The system according to claim 11, wherein the plurality of photoelectric conversion regions includes a first region and a second region that are separated by the first separation portion, and wherein potential of the first separation portion with respect to a signal charge generated in the plurality of photoelectric conversion regions is higher than potential of the first region and the second region with respect to the signal charge.

16. A moving body comprising:

the apparatus according to claim 1; and a control unit configured to control movement of the moving body using a signal output from the apparatus.

17. The moving body according to claim 16, wherein an angle that is formed by the first separation portion and the fourth separation portion is smaller than the angle that is formed by the first separation portion and the second separation portion, wherein each angle is less than or equal to 90 degrees.

18. The moving body according to claim 16, wherein the plurality of photoelectric conversion regions includes a first region and a second region that are separated by the first separation portion, and a third region and a fourth region that are separated by the third separation portion, and wherein, in a plan view, the first region and the third region overlap each other, and the first region and the fourth region do not overlap each other.

19. The moving body according to claim 16, wherein the plurality of photoelectric conversion regions includes a first region and a second region that are separated by the first separation portion, and a third region and a fourth region that are separated by the third separation portion, and wherein a potential difference between the first region and the third region is less than a potential difference between the first region and the fourth region.

20. The moving body according to claim 16, wherein the plurality of photoelectric conversion regions includes a first region and a second region that are separated by the first separation portion, and wherein potential of the first separation portion with respect to a signal charge generated in the plurality of photoelectric conversion regions is higher than potential of the first region and the second region with respect to the signal charge.

\* \* \* \* \*